US012804973B2

(12) United States Patent
Shen et al.

(10) Patent No.: US 12,804,973 B2
(45) Date of Patent: Nov. 17, 2026

(54) METHOD OF MANUFACTURING SEMICONDUCTOR DEVICES AND SEMICONDUCTOR DEVICES

(71) Applicant: TAIWAN SEMICONDUCTOR MANUFACTURING COMPANY, LTD., Hsinchu (TW)

(72) Inventors: Shu-Wen Shen, Hsinchu City (TW); Yen-Po Lin, Taipei City (TW); Chun-Han Chen, Changhua City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 707 days.

(21) Appl. No.: 18/126,298

(22) Filed: Mar. 24, 2023

(65) Prior Publication Data

US 2024/0088223 A1 Mar. 14, 2024

Related U.S. Application Data

(60) Provisional application No. 63/406,349, filed on Sep. 14, 2022.

(51) Int. Cl.

| | |
|---|---|
| ***H10D 62/13*** | (2025.01) |
| ***H10D 30/01*** | (2025.01) |
| ***H10D 30/43*** | (2025.01) |
| ***H10D 30/67*** | (2025.01) |
| ***H10D 84/01*** | (2025.01) |
| ***H10D 84/03*** | (2025.01) |
| ***H10D 84/85*** | (2025.01) |
| *H10D 62/10* | (2025.01) |
| *H10P 14/20* | (2026.01) |

(Continued)

(52) U.S. Cl.

CPC ......... *H10D 62/151* (2025.01); *H10D 30/014* (2025.01); *H10D 30/031* (2025.01); *H10D 30/43* (2025.01); *H10D 84/017* (2025.01); *H10D 84/038* (2025.01); *H10D 84/85* (2025.01); *H10D 30/6735* (2025.01); *H10D 62/121* (2025.01); *H10P 14/24* (2026.01); *H10P 14/3411* (2026.01); *H10P 50/242* (2026.01)

(58) Field of Classification Search

None

See application file for complete search history.

(56) References Cited

U.S. PATENT DOCUMENTS

| | | | | |
|---|---|---|---|---|
| 2006/0115934 | A1* | 6/2006 | Kim | H01L 21/02532 257/E29.267 |
| 2022/0059703 | A1* | 2/2022 | More | H10D 84/017 |
| 2022/0278198 | A1* | 9/2022 | Lee | H10D 30/6735 |

* cited by examiner

*Primary Examiner* — Xiaoming Liu

(74) *Attorney, Agent, or Firm* — STUDEBAKER BRACKETT PLLC

(57) ABSTRACT

In a method of manufacturing a semiconductor device, a field effect transistor (FET) having a metal gate structure, a source and a drain over a substrate is formed. A first frontside contact disposed between dummy metal gate structures is formed over an isolation insulating layer. A frontside wiring layer is formed over the first frontside contact. A part of the substrate is removed from a backside of the substrate so that a bottom of the isolation insulating layer is exposed. A first opening is formed in the isolation insulating layer from the bottom of the isolation insulating layer to expose a bottom of the first frontside contact. A first backside contact is formed by filling the first opening with a conductive material to connect the first frontside contact.

20 Claims, 18 Drawing Sheets

(51) Int. Cl.

| | |
|---|---|
| *H10P 14/24* | (2026.01) |
| *H10P 50/24* | (2026.01) |

METHOD OF MANUFACTURING SEMICONDUCTOR DEVICES AND SEMICONDUCTOR DEVICES

RELATED APPLICATIONS

This application claims priority to U.S. Provisional Patent Application No. 63/406,349 filed Sep. 14, 2022, the entire contents of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a finFET (Fin-FET) using a fin structure as a channel region and a gate-all-around (GAA) FET using multiple nano sheets or nano wires as a channel region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 2:
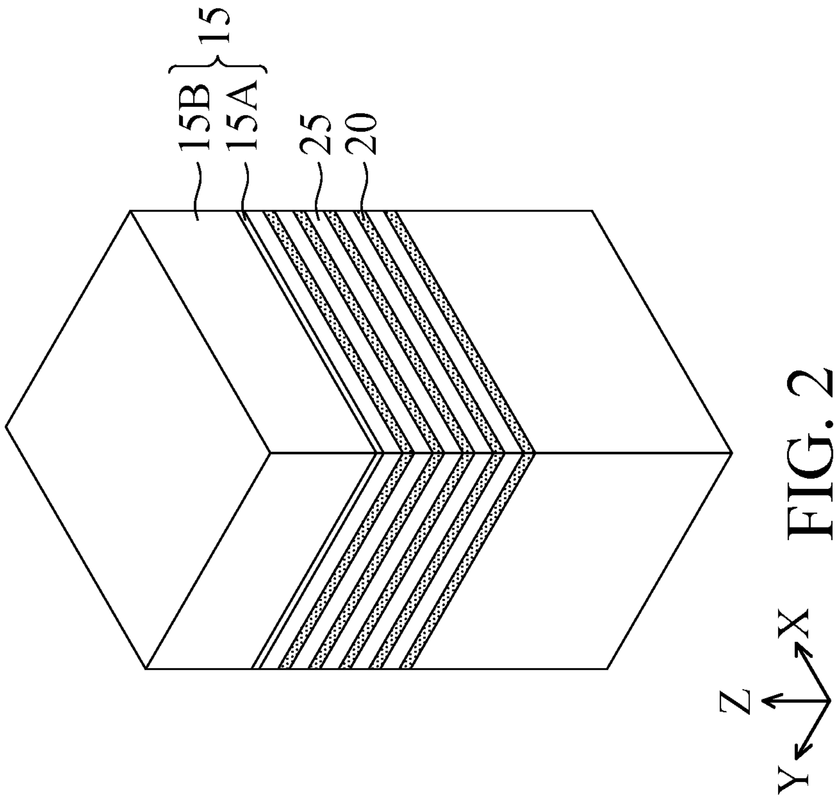
FIGS. 1, 2, 3, 4, 5, 6, 7 and 8 show schematic views of various stages of a sequential manufacturing operation of a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term “made of” may mean either “comprising” or “consisting of.” Further, in the following fabrication process, there may be one or more additional operations in/between the described operations, and the order of operations may be changed. In the following embodiments, the term “upper” “over” and/or “above” are defined along directions with an increase in a distance from the front surface and the back surface. Materials, configurations, dimensions, processes and/or operations as explained with respect to one embodiment may be employed in the other embodiments, and the detailed description thereon may be omitted.

In this disclosure, a semiconductor device includes a semiconductor substrate, a front side circuit disposed over a front surface of the substrate, and a back side circuit disposed over a back surface of the substrate. The front side circuit includes field effect transistors (FETs), such as fin FETs (FinFETs) and gate-all-around FETs (GAA FETs), and other electronic devices and lateral and vertical wiring patterns.

FIGS. 1-22 show a sequential manufacturing process for a semiconductor FET device according to an embodiment of the present disclosure. It is understood that additional operations can be provided before, during, and after processes shown by FIGS. 1-22, and some of the operations described below can be replaced or eliminated, for additional embodiments of the method. The order of the operations/processes may be interchangeable.

Figure 1:
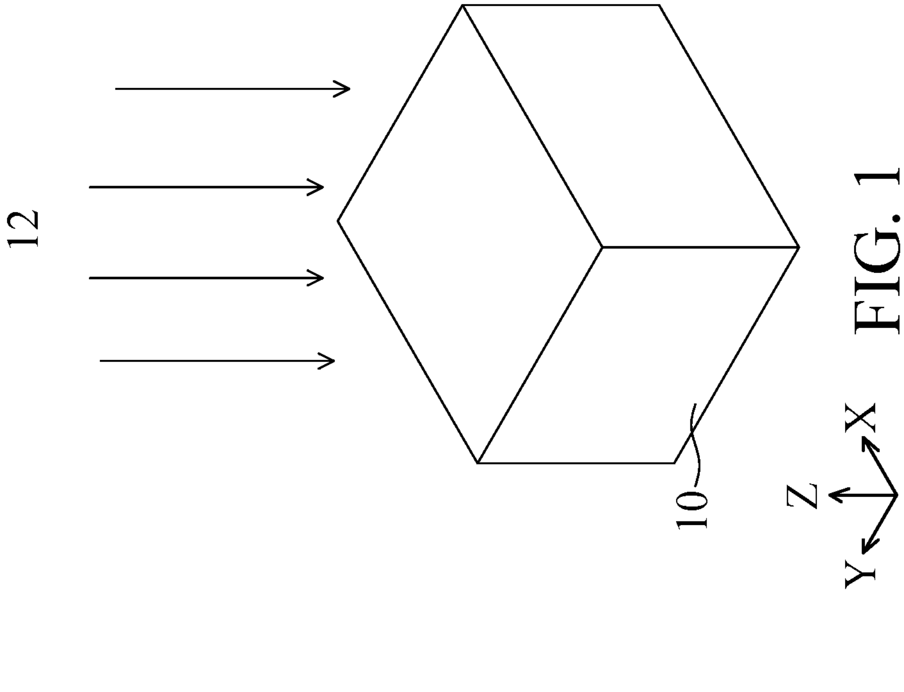

As shown in FIG. 1, impurity ions (dopants) 12 are implanted into a semiconductor substrate (wafer) 10 to form a well region. The ion implantation is performed to prevent a punch-through effect. In some embodiments, the substrate 10 includes a single crystalline semiconductor layer on at least its surface portion. In some embodiments, the substrate 10 is a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si. The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer. The substrate 10 may include various regions that have been suitably doped with impurities (e.g., p-type or n-type conductivity). The dopants 12 are, for example, boron ($BF_2$) for an n-type FinFET and phosphorus for a p-type FinFET.

Then, as shown in FIG. 2, stacked semiconductor layers are formed over the substrate 10. The stacked semiconductor layers include first semiconductor layers 20 and second semiconductor layers 25. Further, a mask layer 15 is formed over the stacked layers. The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is more than about 0.3, or Ge (x=1.0) and the second semiconductor layers 25 are Si or $Si_{1-y}Ge_y$, where y is less than about 0.4, and x>y. In this disclosure, an "M" compound" or an "M based compound" means the majority of the compound is M. In another embodiment, the second semiconductor layers 25 are $Si_{1-y}Ge_y$, where y is more than about 0.3, or Ge, and the first semiconductor layers 20 are Si or $Si_{1-x}Ge_x$, where x is less than about 0.4, and x<y. In yet other embodiments, the first semiconductor layer 20 is made of $Si_{1-x}Ge_x$, where x is in a range from about 0.3 to about 0.8, and the second semiconductor layer 25 is made of $Si_{1-x}Ge_x$, where x is in a range from about 0.1 to about 0.4. In FIG. 2, five layers of the first semiconductor layer 20 and five layers of the second semiconductor layer 25 are disposed. However, the number of the layers are not limited to five, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 5 nm to about 50 nm in some embodiments, and is in a range from about 10 nm to about 30 nm in other embodiments. The thickness of the second semiconductor layers 25 is in a range from about 5 nm to about 30 nm in some embodiments, and is in a range from about 10 nm to about 20 nm in other embodiments. The thickness of each of the first semiconductor layers 20 may be the same, or may vary. In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

In some embodiments, as shown in FIG. 2, the mask layer 15 includes a first mask layer 15A and a second mask layer 15B. The first mask layer 15A is a pad oxide layer made of a silicon oxide, which can be formed by a thermal oxidation. The second mask layer 15B is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 15 is patterned into a mask pattern by using patterning operations including photo-lithography and etching.

Figure 3:
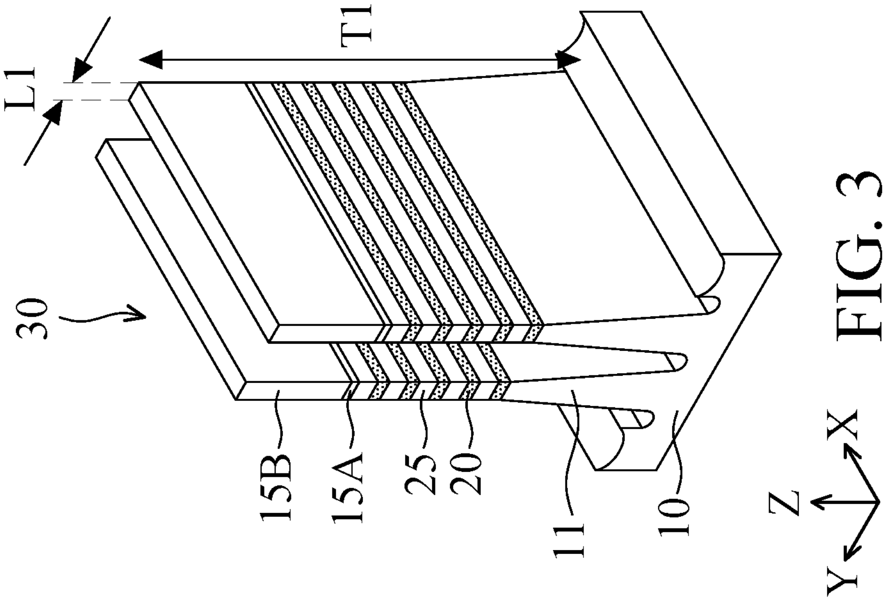

Next, as shown in FIG. 3, the stacked layers of the first and second semiconductor layers 20, 25 are patterned by using the patterned mask layer, thereby the stacked layers are formed into fin structures 30 extending in the X direction. In FIG. 3, two fin structures 30 are arranged in the Y direction. But the number of the fin structures is not limited to, and may be as small as one and three or more. In some embodiments, one or more dummy fin structures are formed on both sides of the fin structures 30 to improve pattern fidelity in the patterning operations.

The fin structures 30 can be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned into mandrels using a photolithography process. Spacers are formed alongside the mandrels using a self-aligned process. The mandrels are then removed, and the remaining spacers may then be used to pattern the fin structures. The multi-patterning processes combining photolithography and self-aligned processes generally result in forming a pair of fin structures.

As shown in FIG. 3, the fin structures 30 have upper portions constituted by the stacked semiconductor layers 20, 25 and well portions 11. The width L1 of the upper portion of the fin structure along the Y direction is in a range from about 5 nm to about 50 nm in some embodiments, and is in a range from about 10 nm to about 30 nm in other embodiments. The height T1 along the Z direction of the fin structure is in a range from about 100 nm to about 200 nm in some embodiments.

After the fin structure is formed, an insulating material layer 41 including one or more layers of insulating material is formed over the substrate so that the fin structures are fully embedded in the insulating layer 41. The insulating material for the insulating layer 41 may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD. An anneal operation may be performed after the formation of the insulating layer 41. Then, a planarization operation, such as a chemical mechanical polishing (CMP) method and/or an etch-back method, is performed such that the upper surface of the uppermost second semiconductor layer 25 is exposed from the insulating material layer 41 as shown in FIG. 4.

Figure 4:
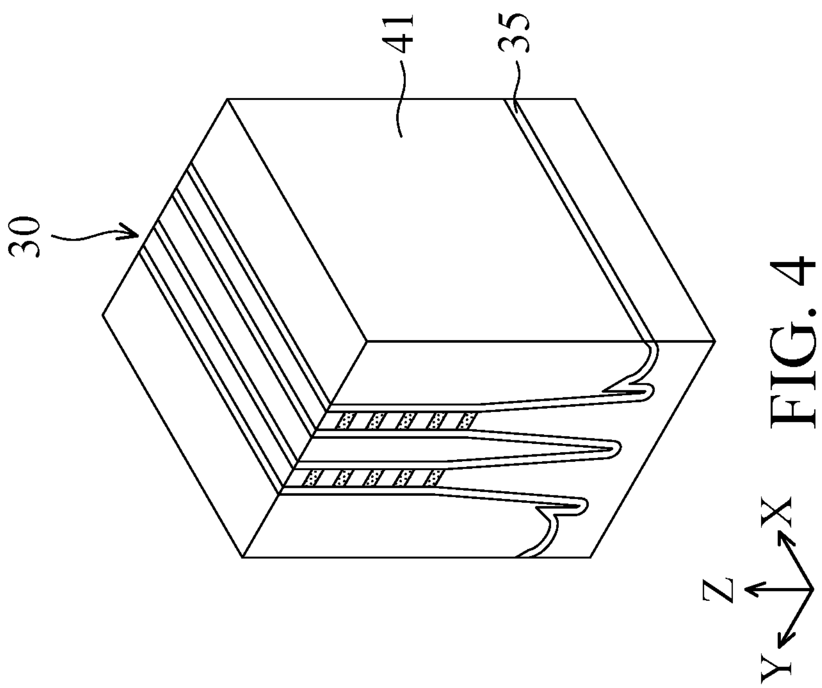

In some embodiments, a first liner layer 35 is formed over the structure of FIG. 3 before forming the insulating material layer 41, as shown FIG. 4. The first liner layer 35 is made of SiN or a silicon nitride-based material (e.g., SiON, SiCN or SiOCN).

Figure 5:
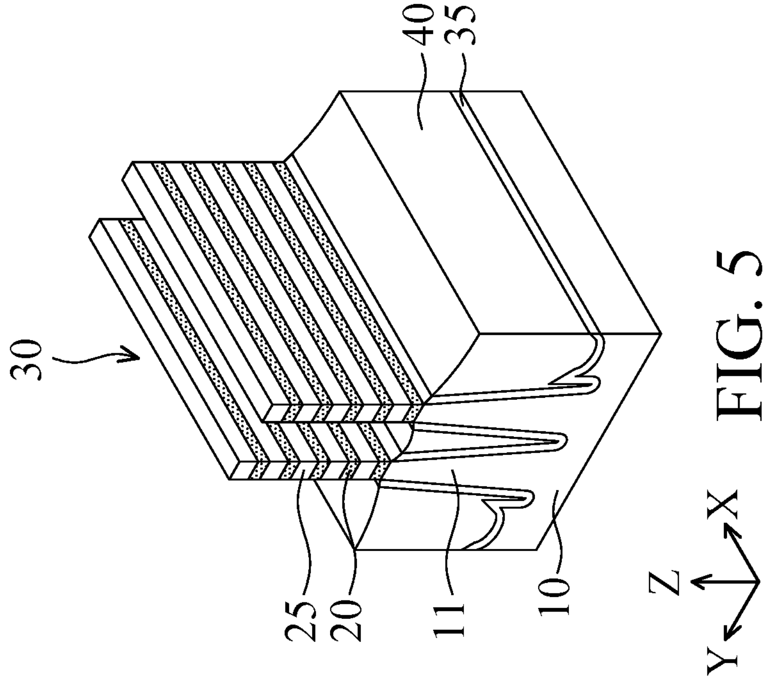

Then, as shown in FIG. 5, the insulating material layer 41 is recessed to form an isolation insulating layer 40 so that the upper portions of the fin structures 30 are exposed. With this operation, the fin structures 30 are electrically separated from each other by the isolation insulating layer 40, which is also called a shallow trench isolation (STI).

In the embodiment shown in FIG. 5, the insulating material layer 41 is recessed until the bottommost first semiconductor layer 20 is exposed. In other embodiments, the upper portion of the well layer 11 is also partially exposed. The first semiconductor layers 20 are sacrificial layers which are subsequently partially removed, and the second semiconductor layers 25 are subsequently formed into channel layers of a GAA FET.

Figure 6:
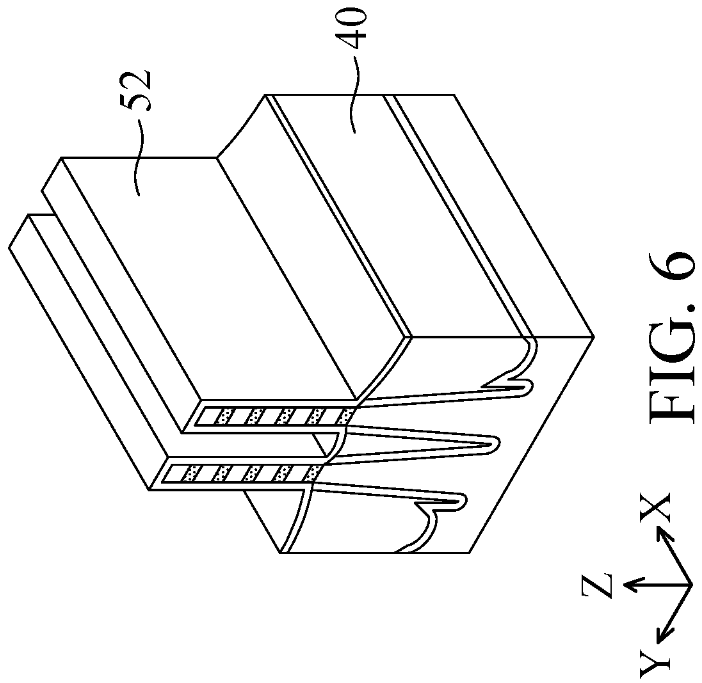

After the isolation insulating layer 40 is formed, a sacrificial gate dielectric layer 52 is formed, as shown in FIG. 6. The sacrificial gate dielectric layer 52 includes one or more layers of insulating material, such as a silicon oxide-based material. In one embodiment, silicon oxide formed by CVD is used. The thickness of the sacrificial gate dielectric layer 52 is in a range from about 1 nm to about 5 nm in some embodiments.

Figure 7:
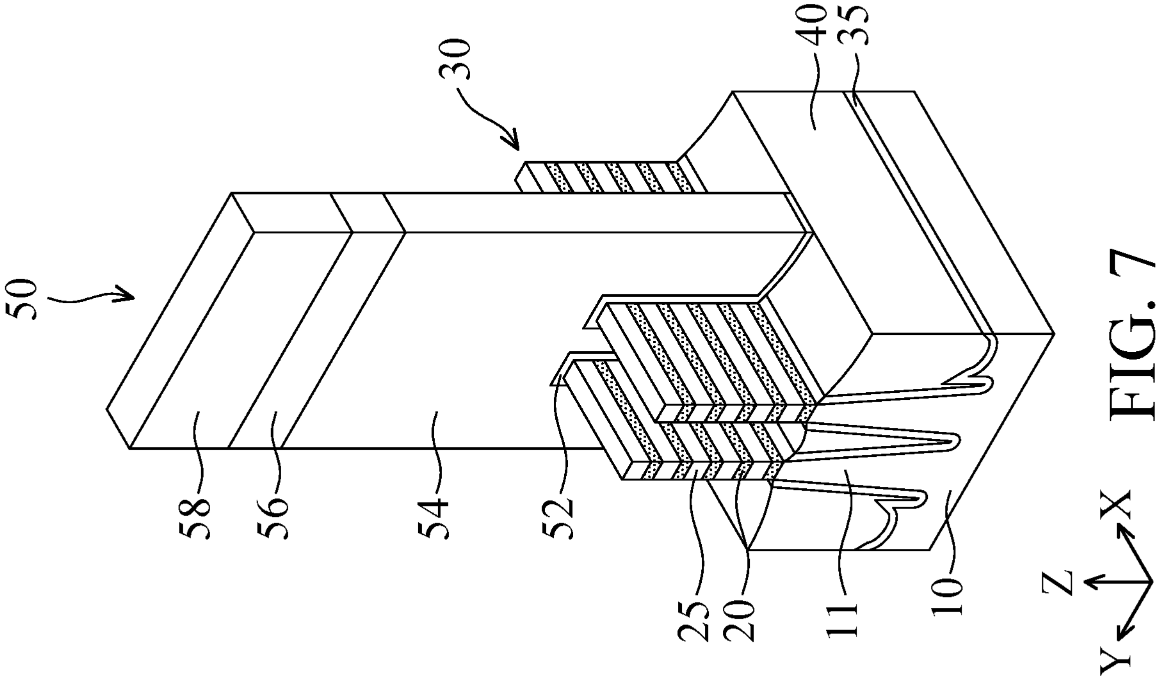

FIG. 7 illustrates a structure after a sacrificial gate structure 50 is formed over the exposed fin structures 30. The sacrificial gate structure includes a sacrificial gate electrode 54 and the sacrificial gate dielectric layer 52. The sacrificial gate structure 50 is formed over a portion of the fin structure which is to be a channel region. The sacrificial gate structure defines the channel region of the GAA FET.

The sacrificial gate structure 50 is formed by first blanket depositing the sacrificial gate dielectric layer 52 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer 56 and a silicon oxide mask layer 58.

Next, a patterning operation is performed on the mask layer and sacrificial gate electrode layer is patterned into the sacrificial gate structure 50, as shown in FIG. 7. The sacrificial gate structure includes the sacrificial gate dielectric layer 52, the sacrificial gate electrode layer 54 (e.g., poly silicon), the pad SiN layer 56 and the silicon oxide mask layer 58. By patterning the sacrificial gate structure, the stacked layers of the first and second semiconductor layers are partially exposed on opposite sides of the sacrificial gate structure, thereby defining source/drain (S/D) regions, as shown in FIG. 7. In this disclosure, a source (region) and a drain (region) are interchangeably used, and the structures thereof are substantially the same. In FIG. 7, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Figure 8:
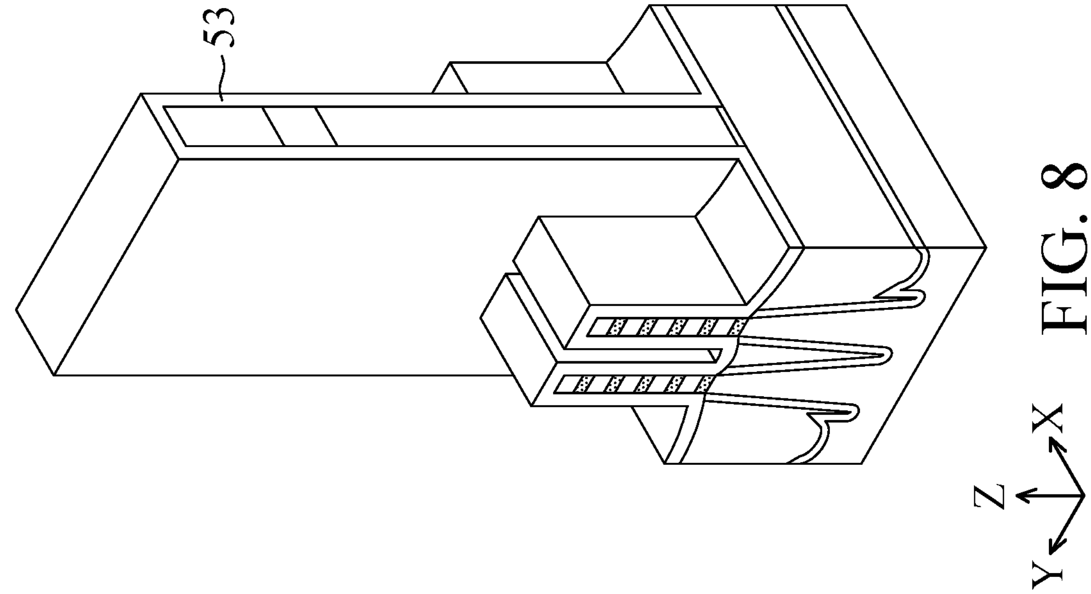

After the sacrificial gate structure is formed, a blanket layer 53 of an insulating material for sidewall spacers 55 is conformally formed by using CVD or other suitable methods, as shown in FIG. 8. The blanket layer 53 is deposited in a conformal manner so that it has substantially equal thicknesses on vertical surfaces, such as the sidewalls, horizontal surfaces, and the top of the sacrificial gate structure. In some embodiments, the blanket layer 53 is deposited to a thickness in a range from about 2 nm to about 10 nm. In one embodiment, the insulating material of the blanket layer 53 is a silicon nitride-based material, such as SiN, SiON, SiOCN or SiCN and combinations thereof.

Figure 9B:
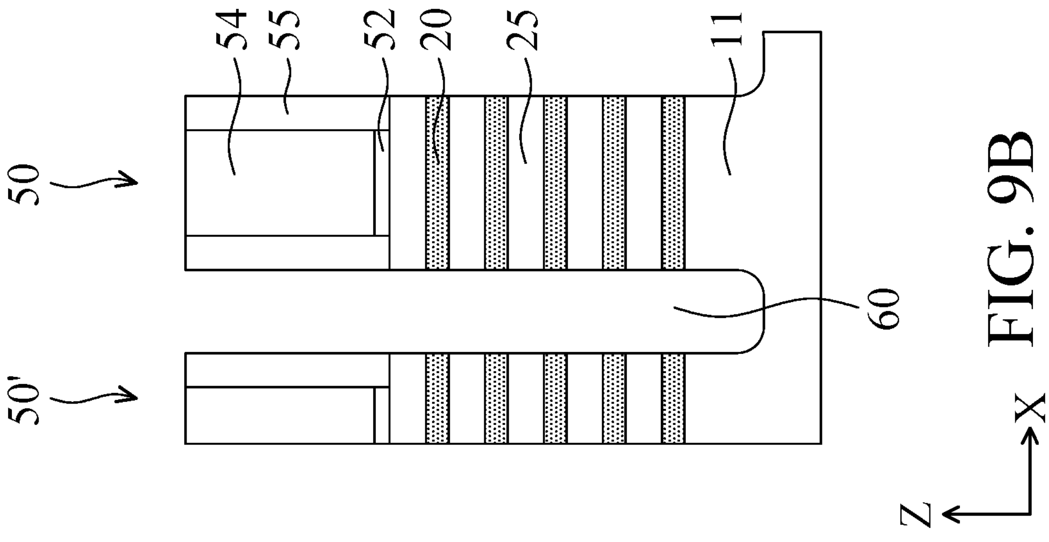
FIGS. 9A and 9B show schematic views of one of the various stages of a sequential manufacturing operation of a semiconductor device according to an embodiment of the present disclosure.
Figure 9A:
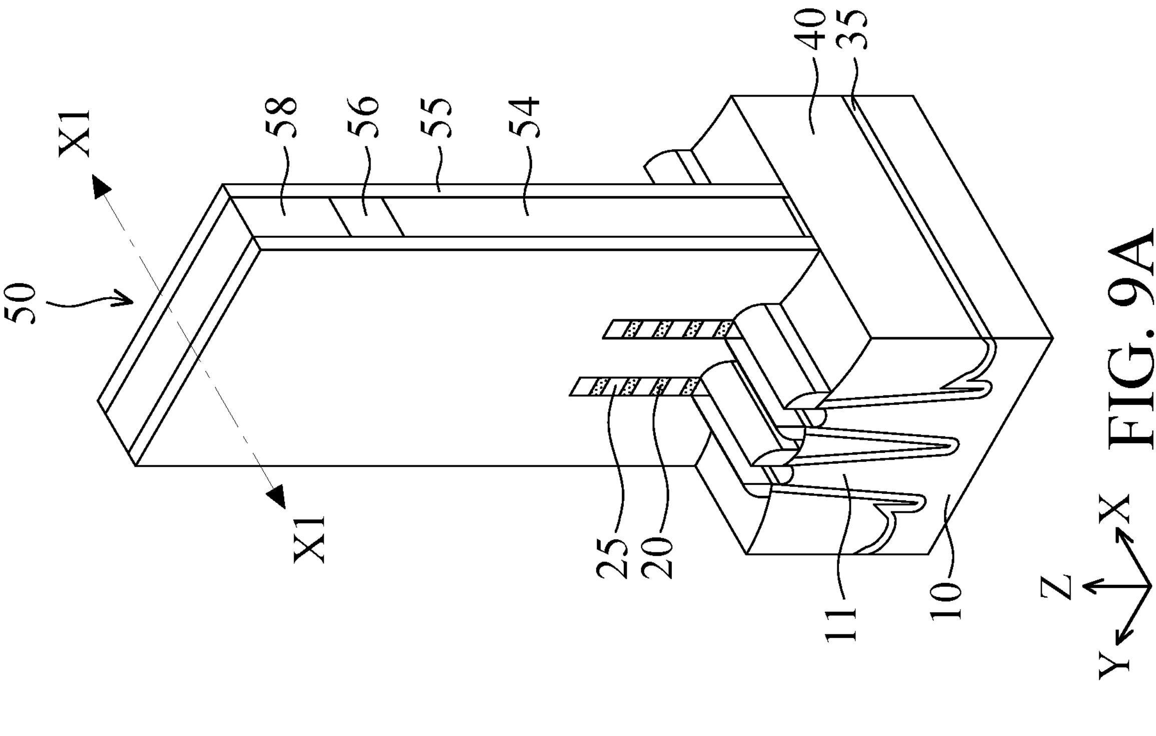

Further, as shown in FIGS. 9A and 9B, sidewall spacers 55 are formed on opposite sidewalls of the sacrificial gate structures, and subsequently, the fin structures of the S/D regions are recessed down below the upper surface of the isolation insulating layer 40. FIG. 9B is the cross sectional view corresponding to line X1-X1 of FIG. 9A. In FIG. 9B, the cross section of the bottom parts of one sacrificial gate structure 50 and an adjacent sacrificial gate structure 50' are illustrated.

After the blanket layer 53 is formed, anisotropic etching is performed on the blanket layer 53 using, for example, reactive ion etching (RIE). During the anisotropic etching process, most of the insulating material is removed from horizontal surfaces, leaving the dielectric spacer layer on the vertical surfaces such as the sidewalls of the sacrificial gate structures and the sidewalls of the exposed fin structures. The mask layer 58 may be exposed from the sidewall spacers. In some embodiments, isotropic etching may be subsequently performed to remove the insulating material from the upper portions of the S/D region of the exposed fin structures 30.

Subsequently, the fin structures of the S/D regions are recessed down below the upper surface of the isolation insulating layer 40, by using dry etching and/or wet etching. As shown in FIG. 9A, the sidewall spacers 55 formed on the S/D regions of the exposed fin structures partially remain. In other embodiments, however, the sidewall spacers 55 formed on the S/D regions of the exposed fin structures are fully removed. At this stage, end portions of the stacked layer of the first and second semiconductor layers 20, 25 under the sacrificial gate structure have substantially flat faces which are flush with the sidewall spacers 55, as shown in FIG. 9B. In some embodiments, the end portions of the stacked layer of the first and second semiconductor layers 20, 25 are slightly horizontally etched.

Figure 10B:
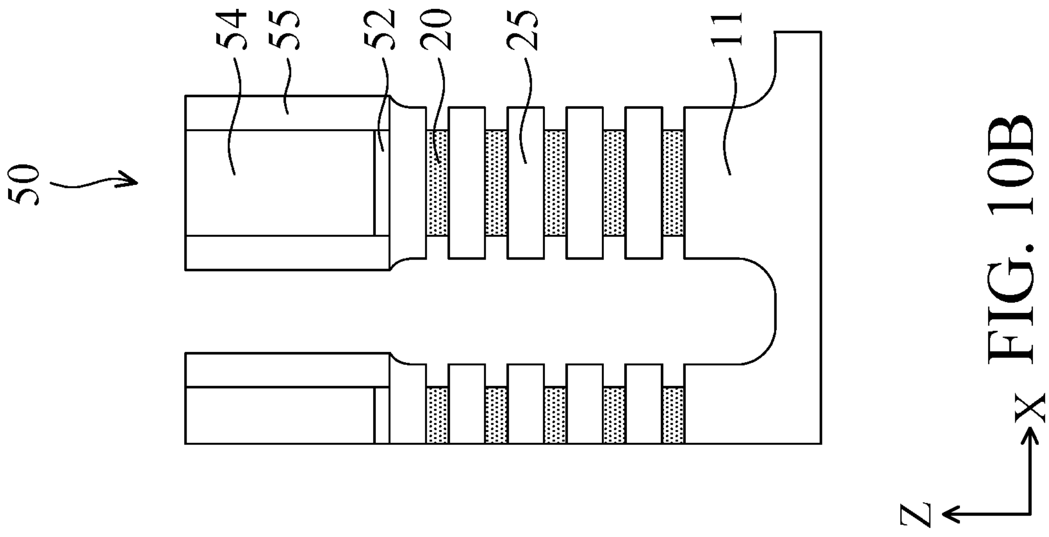
FIGS. 10A and 10B show schematic views of one of the various stages of a sequential manufacturing operation of a semiconductor device according to an embodiment of the present disclosure.
Figure 10A:
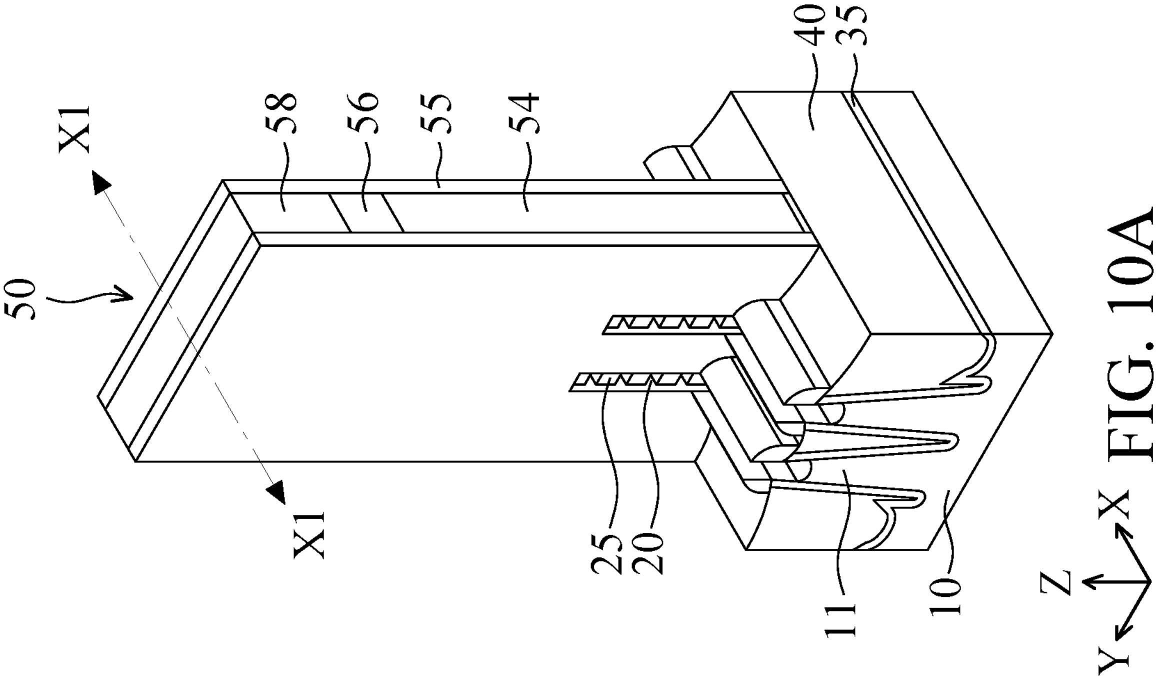

Subsequently, as shown in FIGS. 10A and 10B, the first semiconductor layers 20 are horizontally recessed (etched) so that edges of the first semiconductor layers 20 are located substantially below a side face of the sacrificial gate electrode layer 54. In some embodiments, as shown in FIG. 10B, end portions (edges) of the first semiconductor layers 20 under the sacrificial gate structure are substantially aligned with the side faces of the sacrificial gate electrode layer 54. Here, "being substantially aligned" means the difference in the relative position is less than about 1 nm. In some embodiments, the ends of the first semiconductor layers 20 are curved convex toward inside of the first semiconductor layers 20. In some embodiments, during the recess etching of the first semiconductor layers 20 and/or the recess etching of the first and second semiconductor layers, end portions of the second semiconductor layers 25 are also horizontally etched. The recessed amount of the first semiconductor layers 20 is greater than the recessed amount of the second semiconductor layers 25.

Figure 11A:
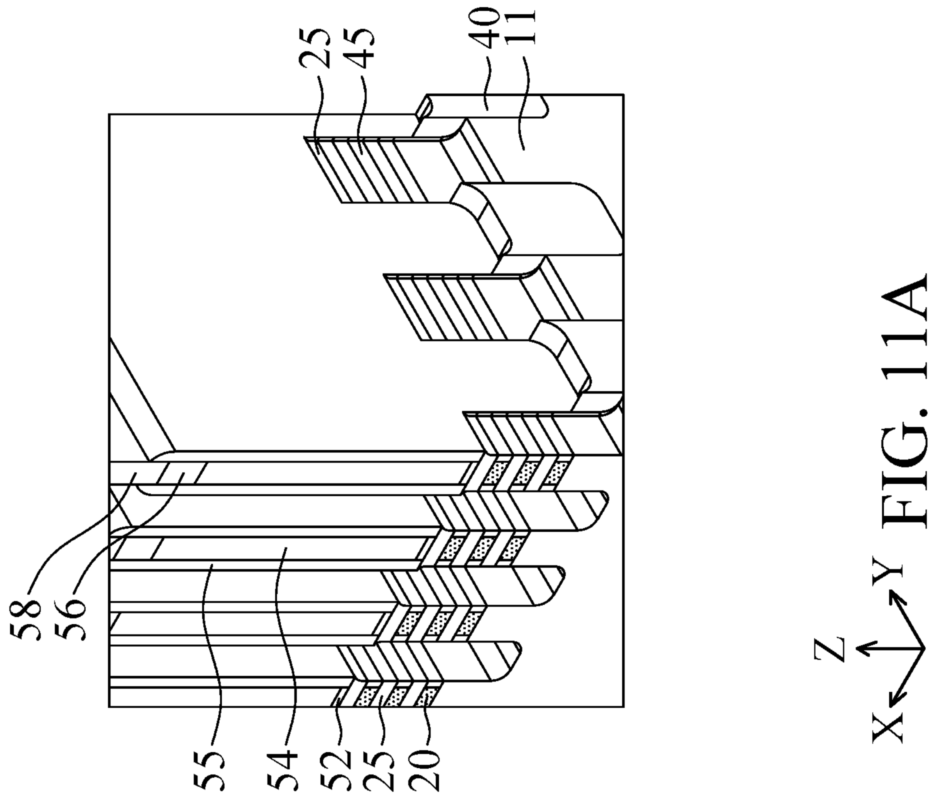
FIGS. 11A and 11B show schematic views of one of the various stages of a sequential manufacturing operation of a semiconductor device according to an embodiment of the present disclosure.
Figure 11B:
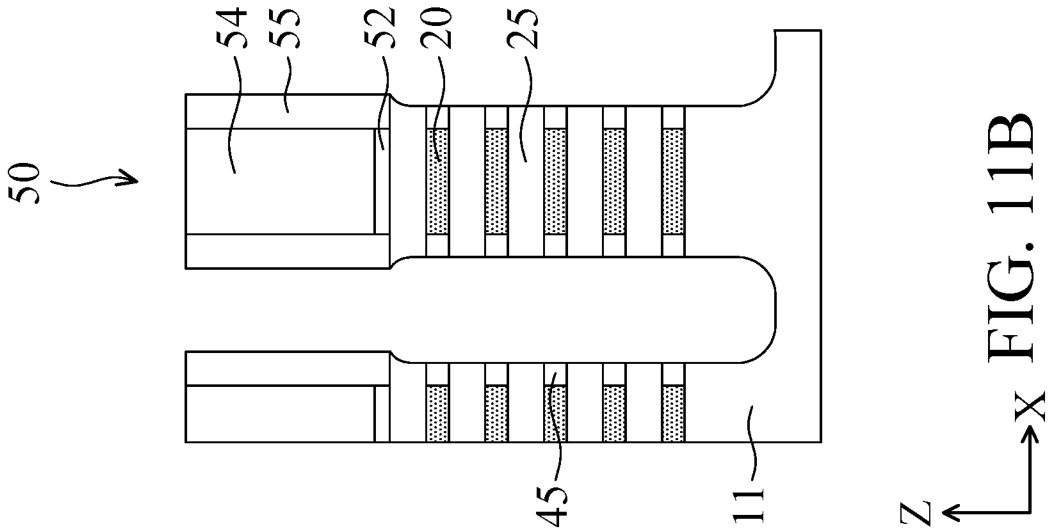

After the first semiconductor layers 20 are horizontally recessed, one or more dielectric layers are conformally formed on the end surfaces of the first and second semiconductor layers 20, 25, on the well layer 11 and over the sacrificial gate structures 50. Then, anisotropic etching is performed to form inner spacers 45 on the end faces of the first semiconductor layers 20 as shown in FIGS. 11A and 11B. The inner spacers 45 are made of one or more of silicon nitride and silicon oxide, SiON, SiOC, SiCN or SiOCN, or any other suitable dielectric material.

Figure 12B:
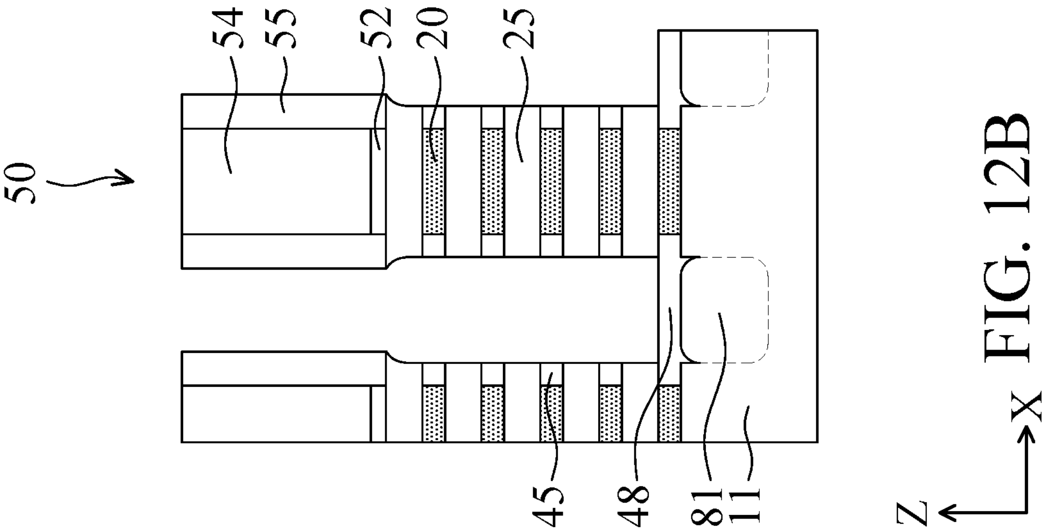
FIGS. 12A and 12B show schematic views of one of the various stages of a sequential manufacturing operation of a semiconductor device according to an embodiment of the present disclosure.
Figure 12A:
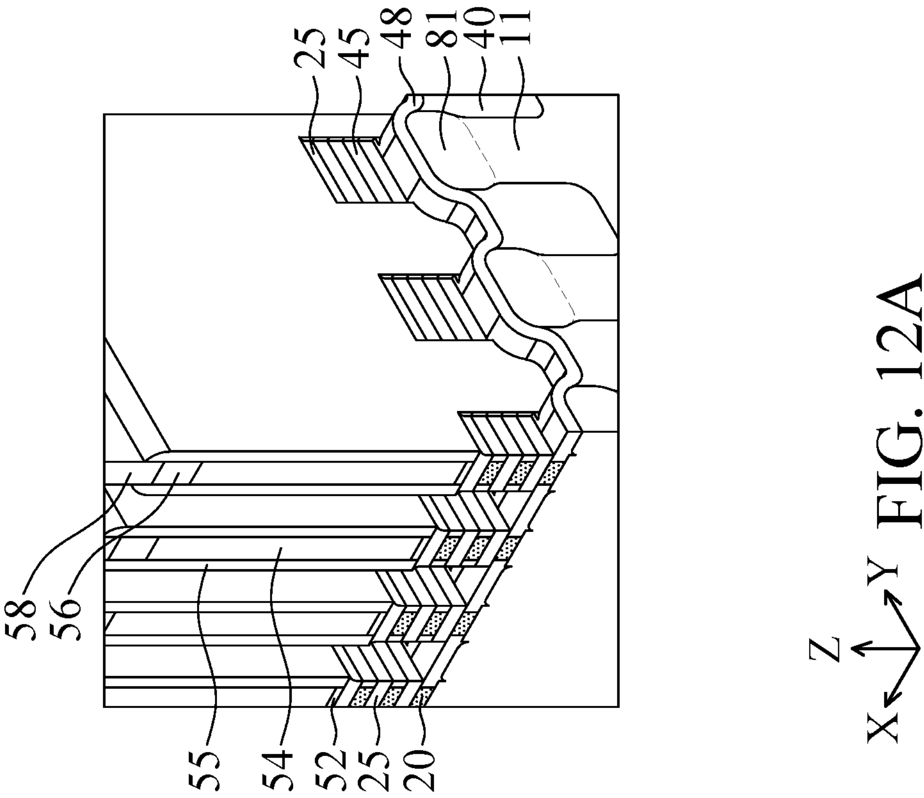

After the inner spacers 45 are formed, a bottom epitaxial layer 81 is formed over the recessed well layer 11, and then a dielectric layer 48 is formed over the bottom epitaxial layer 81 and the isolation insulating layer 40, as shown in FIGS. 12A and 12B.

In some embodiments, the bottom epitaxial layer 81 is a non-doped epitaxial semiconductor layer, such as Si or SiGe. In some embodiments, the dielectric layer 48 includes one or more of silicon nitride and silicon oxide, SiON, SiOC, SiCN and SiOCN, or any other suitable dielectric material, which is the same as or different from the dielectric material of the isolation insulating layer 40, sidewall spacer 55 and/or the inner spacers 45.

Figure 13B:
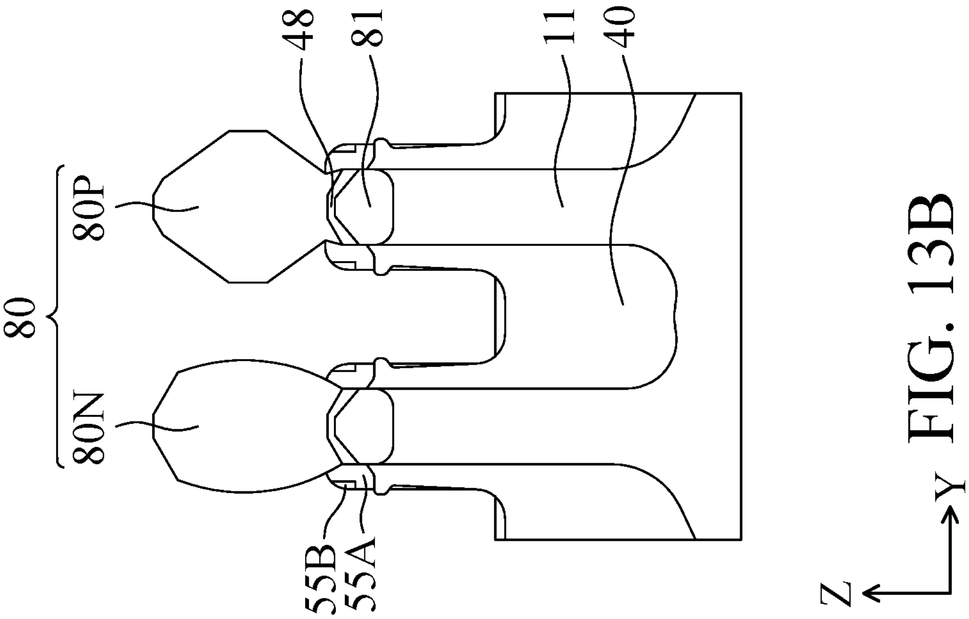
FIGS. 13A and 13B show schematic views of one of the various stages of a sequential manufacturing operation of a semiconductor device according to an embodiment of the present disclosure.
Figure 13A:
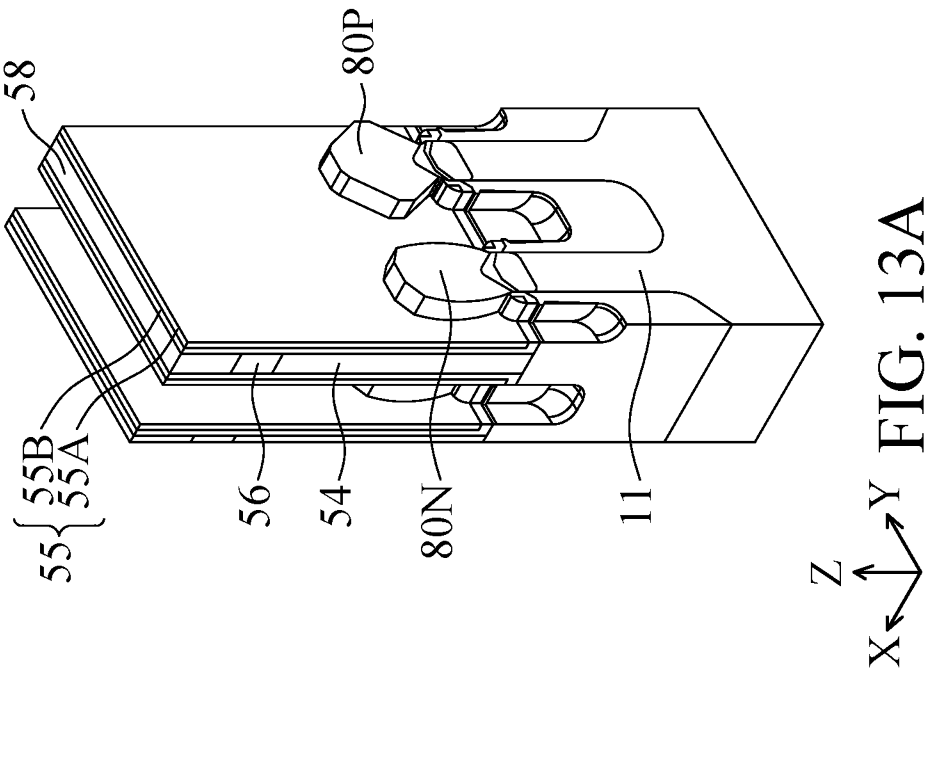

Next, as shown in FIGS. 13A and 13B, a second epitaxial layer (source/drain epitaxial layer) 80 is formed on the end faces of the second semiconductor layers 25. In some embodiments, the second epitaxial layer 80 includes an n-type epitaxial layer 80N and a p-type epitaxial layer 80P as shown in FIGS. 13A and 13B, which are separately formed. The n-type source/drain epitaxial layer 80N includes one or more layers of SiP, SiAs, SiCP, SiPAs and/or SiC for an n-type FET, and the p-type epitaxial layer 80P includes SiGe, GeSn and/or SiGeSn for a p-type FET. For the p-type FET, the source/drain epitaxial layer 80P is doped with B (boron) in some embodiments. In some embodiments, the source/drain epitaxial layer includes multiple layers. The source/drain epitaxial layers are formed by an epitaxial growth method using CVD, ALD or molecular beam epitaxy (MBE).

In some embodiments, no dielectric layer 48 is formed and the source/drain epitaxial layer 80 is formed directly on the bottom epitaxial layer 81. In some embodiments, the gate sidewall spacers 55 include first sidewall spacers 55A and second sidewall spacers 55B made of a different material than the first sidewall spacers 55A.

In some embodiments, the source/drain epitaxial layer of an n-type FET includes a first epitaxial layer 82 grown from the end faces of the second semiconductor layer 25 and a second epitaxial layer 84 formed on the first epitaxial layer, as shown in FIGS. 14A-14D. In some embodiments, the first epitaxial layer 82 is made of SiP, SiAs or SiAs:P or a combination thereof. In some embodiments, the P concentration of the first epitaxial layer 82 is in a range from about $0.5\times10^{19}$ atoms/cm 3 to about $5\times10^{20}$ atoms/$cm^3$, and is in a range from about $0.8\times10^{19}$ atoms/cm 3 to about $2\times10^{20}$ atoms/$cm^3$ in other embodiments. In some embodiments, the second epitaxial layer 84 is made of SiP. In some embodiments, the P concentration of the second epitaxial layer 84 is higher than that of the first SiP epitaxial layer, and is in a range from about $1\times10^{21}$ atoms/$cm^3$ to about $5\times10^{21}$ atoms/$cm^3$, and is in a range from about $2\times10^{21}$ atoms/$cm^3$ to about $4\times10^{21}$ atoms/$cm^3$ in other embodiments.

Figure 14E:
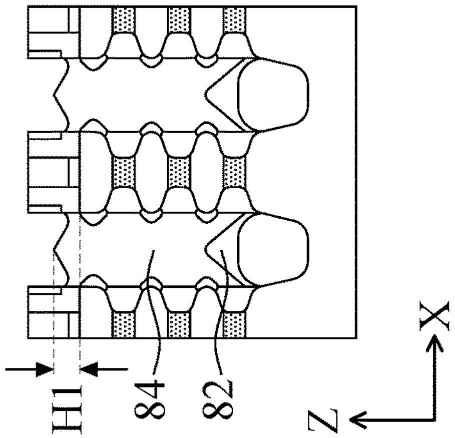
FIGS. 14A, 14B, 14C, 14D, 14E, 14F and 14G show schematic views of the various stages of a sequential manufacturing operation of a semiconductor device according to an embodiment of the present disclosure.
Figure 14F:
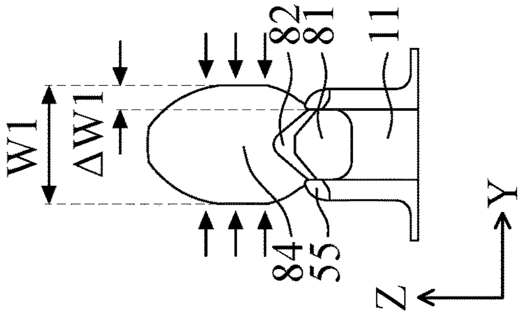
Figure 14G:
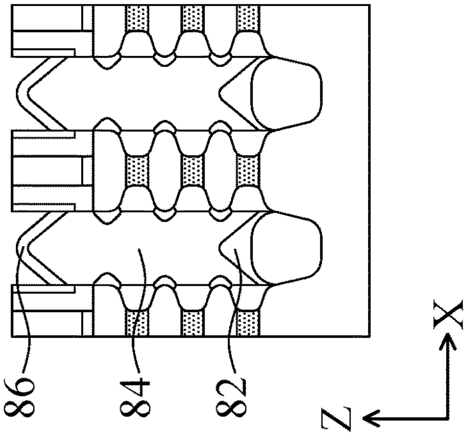
Figure 14A:
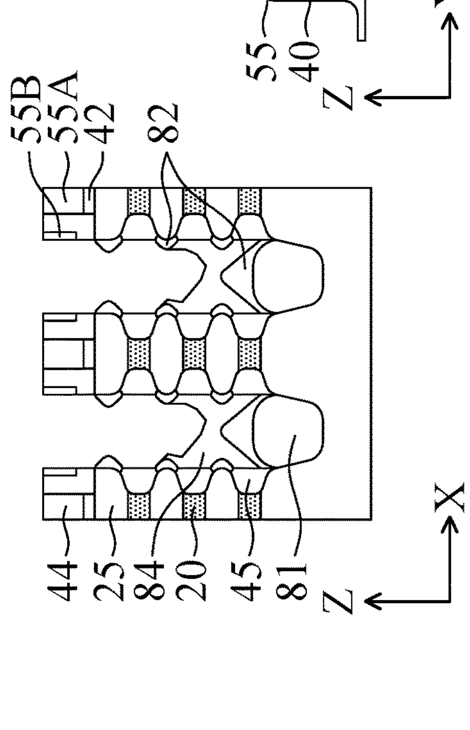
Figure 14B:
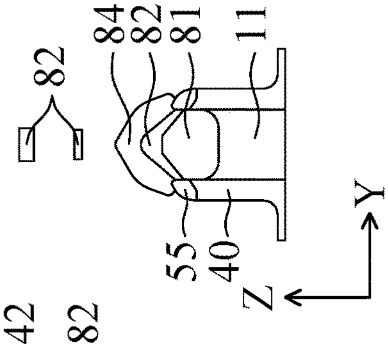

In some embodiments, as shown in FIGS. 14A and 14B, in an n-type FET, the first epitaxial layer 82 is formed on the ends of the second semiconductor layers 25. In some embodiments, the first epitaxial layer 82 is formed over the dielectric layer 48. In some embodiments, the first epitaxial layer 82 formed over the dielectric layer 48 has a lower crystallinity than the first epitaxial layer 82 formed on the ends of the second semiconductor layers 25, and is polycrystalline or amorphous. In FIGS. 14A-14F, no dielectric layer 48 is formed and the first epitaxial layer 82 is directly formed on the bottom epitaxial layer 81. In some embodiments, the second epitaxial layer 84 is not in contact with the bottom epitaxial layer 81. When the dielectric layer 48 is formed, the first epitaxial layer 82 is grown from the lateral end faces of the second semiconductor layer and the second epitaxial layer 84 is formed on the first epitaxial layer 82, and substantially no first epitaxial layer is formed on the dielectric layer 48 (no first epitaxial layer 82 is formed on at least the center of the dielectric layer 48) as shown in FIG. 15B.

The second epitaxial layer 84 is formed on the first epitaxial layer 82 as shown in FIGS. 14A-14D. After the second epitaxial layer 84 is formed, the top of the second epitaxial layer 84 is located at a height H0 from the interface between the sacrificial gate dielectric layer 52 and the uppermost one of the second semiconductor layers 25 (the top of the fin structure) and has a width W0. In some embodiments, the width W0 is in a range from about 36 nm to about 38 nm and the height H0 is in a range from about 4.8 nm to about 5.2 nm. In some embodiments, the variation (max-min) of the height H0 (e.g., measured at 10 points (e.g., 10 FETs) in a chip) is more than about 0.2 nm to and less than about 1.0 nm. In some embodiments, the variation (max-min) of the width W0 (e.g., measured at 10 points (e.g., 10 FETs) in a chip) is more than about 0.5 nm to and less than about 1.4 nm.

In some embodiments, the source/drain epitaxial layers 82 and/or 84 of the n-type source/drain epitaxial layer is formed by a bottom-up growth method. In some embodiments, the epitaxial layer growth process includes a deposition phase and an etching phase, and a ratio of the deposition phase to the etching phase is determined by process times for the deposition phase and the etching phase followed by the deposition phase.

In some embodiments, the epitaxial growth of the first epitaxial layer 82 includes a first process and a second process followed by the first process. In some embodiments, the ratio of the deposition phase to the etching phase in the first process (process times ratio) is greater than the ratio of the deposition phase to the etching phase in the second process. In some embodiments, the ratio of the deposition phase to the etching phase in the first process is set in a range from about 1.3 to about 1.5, and the ratio of the deposition phase to the etching phase in the second process is set in a range from about 1.11 to about 1.15. In some embodiments, the process time of the first process is smaller than the process time of the second process. In some embodiments, the process gas for forming the first epitaxial layer 82 includes $SiH_2Cl_2$ for deposition with an appropriate dopant and HCl for etching. In some embodiments, $SiH_4$ is used instead of or in addition to $SiH_2Cl_2$. In some embodiments, two or more deposition phases are performed and one or more etching phases are performed. In some embodiments, the first process (deposition and etching) is performed once and the second process (deposition and etching) is performed twice.

In some embodiments, after the first epitaxial layer 82 is formed by the second process, a treatment using a mixture of $SiH_4$ and HCl is performed for about 1 min to 3 min.

In some embodiments, the ratio of the deposition phase to the etching phase for the second epitaxial layer 84 is greater than the ratio of the deposition phase to the etching phase in the second process for the first epitaxial layer 82. In some embodiments, the ratio of the deposition phase to the etching phase for the second epitaxial layer 84 is set in a range from about 1.18 to about 1.26. In some embodiments, the process gas for forming the second epitaxial layer 84 includes $SiH_2Cl_2$ for deposition with an appropriate dopant and HCl for etching. In some embodiments, $SiH_4$ is used instead of or in addition to $SiH_2Cl_2$. In some embodiments, no merger between adjacent epitaxial layers occurs.

In some embodiments, as shown in FIGS. 14E and 14F, the second epitaxial layer 84 is trimmed by using one or more etching operations to reduce the width and the height. In some embodiments, the etching is selective etching having a higher etching rate for a (110) crystal orientation of the epitaxial layer (the side faces). In some embodiments, the etching is plasma or chemical etching using, for example, $SiH_4$ or $GeH_4$ and HCl as an etching gas. In some embodiments, the trimming includes a first process using $GeH_4$ and HCl as an etching gas and a second process using $SiH_4$ and HCl as an etching gas followed by the first process. In some embodiments, the process time of the first process is shorter than the process time of the second process.

In some embodiments, an additional epitaxial layer 86 (a third epitaxial layer) as a cap layer (e.g., a SiP layer) is formed over the layer formed by the second process as shown in FIG. 14G. The cap layer 86 protects the underlying layer during the trimming etching. In some embodiments, the cap layer 86 remains after the trimming, and in other embodiments, the cap layer 86 is fully removed in the trimming.

Figure 14C:
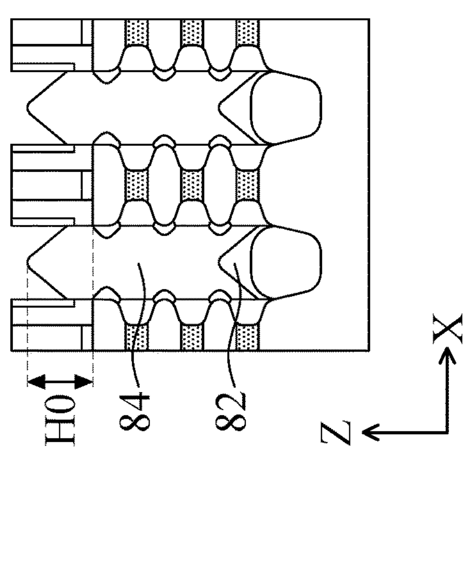
Figure 14D:
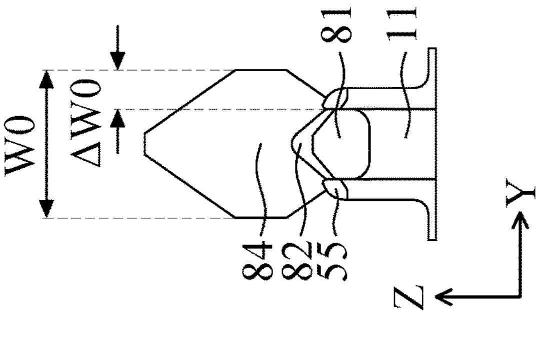
Figure 15B:
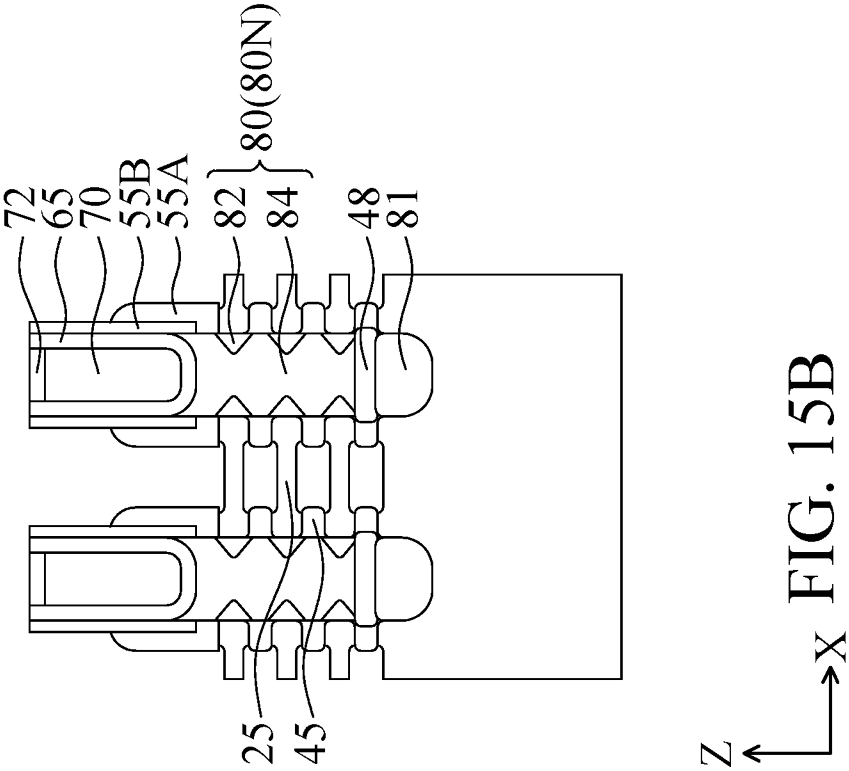
FIGS. 15A and 15B show schematic views of one of the various stages of a sequential manufacturing operation of a semiconductor device according to an embodiment of the present disclosure.

H1 in FIG. 14E corresponds to H0 in FIG. 14C and W1 in FIG. 14F corresponds to W0 in FIG. 14D. In some embodiments, the height H1 is about 85-95% of H0 and the width W1 is about 70-90% of W0. In some embodiments, the vertical trimming amount in nanometer (reduction in height) is smaller (e.g., 30-60%) of the horizontal trimming amount (reduction in width). In some embodiments, the width W1 is in a range from about 32 nm to about 35 nm and the height H1 is in a range from about 4.3 nm to about 4.9 nm. In some embodiments, the variation (max-min) of the height H1 (e.g., measured at 10 points (e.g., 10 FETs) in a chip) is more than about 0.1 nm to and less than about 0.8 nm. In some embodiments, the variation (max-min) of the width W1 (e.g., measured at 10 points (e.g., 10 FETs) in a chip) is more than about 0.3 nm to and less than about 1.0 nm. With the forgoing epitaxial growth process, more uniform dimensions (width and/or height) of the epitaxial layer are obtained.

In some embodiments, the lateral extending amount ΔW0 or ΔW1 are measured from the interface between the first epitaxial layer 82 and the gate sidewall spacer 55 (substantially equal to (W0 or W1−width of the first epitaxial layer at the interface between the first epitaxial layer 82 and the gate sidewall spacer 55)/2). In some embodiments, a ratio ΔW1/H1 before the trimming is in a range from about 0.8 to about 0.9. In some embodiments, a ratio ΔW1/H1 after the trimming is in a range from about 1.4 to about 1.8. Thus, as shown in FIGS. 14E and 14F, a narrower and higher epitaxial layer 84 is obtained in the present embodiments.

In some embodiments, the source/drain epitaxial layer of a p-type FET includes a first epitaxial layer, and a second epitaxial layer similar to the n-type FET as above. In some embodiments, the first epitaxial layer is made of SiGe doped with B. In some embodiments, the Ge content is in a range from about 15 atomic % to about 30 atomic %. In some embodiments, the B concentration of the first epitaxial layer is in a range from about $1\times10^{19}$ atoms/cm$^3$ to about $1\times10^{21}$ atoms/cm$^3$, and is in a range from about $5\times10^{19}$ atoms/cm$^3$ to about $5\times10^{20}$ atoms/cm 3 in other embodiments. In some embodiments, the second epitaxial layer is made of SiGe doped with B. In some embodiments, the Ge content of the second epitaxial layer is in a range from about 20 atomic % to about 35 atomic %. In some embodiments, the B concentration of the second epitaxial layer is equal to or higher than the largest B concentration of the first epitaxial layer, and is in a range from about $0.5\times10^{20}$ atoms/cm 3 to about $1\times10^{21}$ atoms/cm$^3$, and is in a range from about $1\times10^{20}$ atoms/cm 3 to about $5\times10^{20}$ atoms/cm 3 in other embodiments.

In some embodiments, unlike the n-type epitaxial layer, no trimming operation as explained with respect to FIGS. 14A-14F is performed. Thus, the width (largest width) of the p-type epitaxial layer 80P is greater than the width of the n-type epitaxial layer 80N.

Figure 15A:
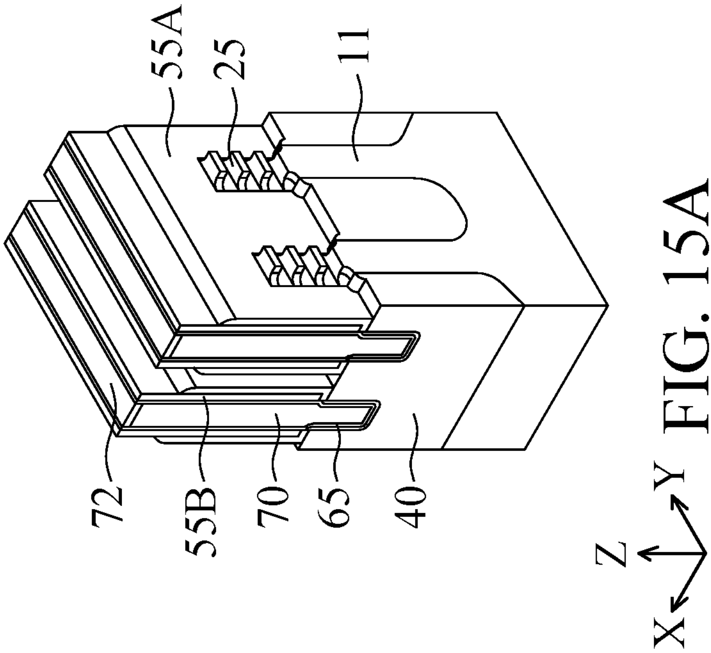

After the source/drain epitaxial layers are formed, as shown in FIGS. 15A and 15B, a first etch stop layer (ESL) 65 is formed over the sacrificial gate structure 50 and the S/D epitaxial layer 80. The first ESL 65 is made of silicon nitride, SiON or any other suitable dielectric material and has a thickness in a range from about 1 nm to about 20 nm in some embodiments. Further, a first interlayer dielectric (ILD) layer 70 is formed over the ESL 65. In some embodiments, the first ILD layer 70 is made of silicon oxide, SiON, SiOCN, SiOC, SiCN or any other suitable dielectric material, different from the first ESL 65. After the first ILD layer 70 is formed, one or more planarization operations, such as chemical mechanical polishing (CMP), are performed to expose the sacrificial gate electrode 54. In some embodiments, after the CMP operation, the first ILD layer 70 is slightly recessed and a cap dielectric layer 72 is formed over the recessed ILD layer 70. In some embodiments, the cap dielectric layer 72 includes silicon nitride, SiON, or SiCN.

Then, the sacrificial gate electrode 54 and sacrificial gate dielectric layer 52 are removed. The first ILD layer 70 protects the source/drain epitaxial layer 80 during the removal of the sacrificial gate structures. The sacrificial gate structures can be removed using plasma dry etching and/or wet etching. When the sacrificial gate electrode 54 is polysilicon, a wet etchant such as a TMAH solution can be used to selectively remove the sacrificial gate electrode 54. The sacrificial gate dielectric layer 52 is thereafter removed using plasma dry etching and/or wet etching.

After the sacrificial gate structures are removed, the first semiconductor layers 20 are removed, thereby forming wires or sheets (channel regions) of the second semiconductor layers 25, as shown in FIGS. 15A and 15B. The first semiconductor layers 20 can be removed or etched using an etchant that can selectively etch the first semiconductor layers 20 against the second semiconductor layers 25. Since the inner spacers 45 are formed, the etching of the first semiconductor layers 20 stops at the inner spacers 45.

Figure 16B:
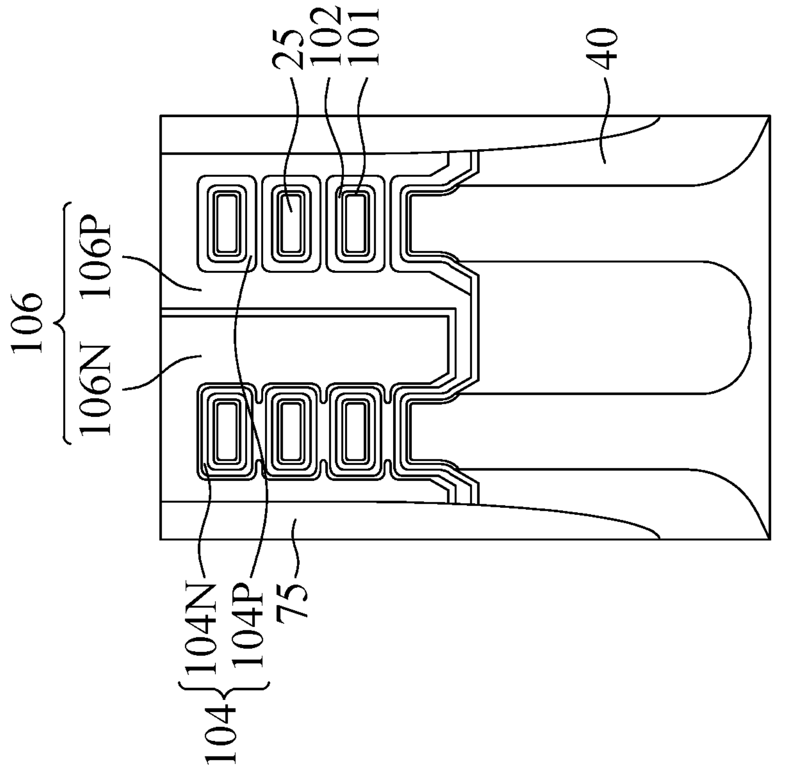
FIGS. 16A and 16B show schematic views of one of the various stages of a sequential manufacturing operation of a semiconductor device according to an embodiment of the present disclosure.
Figure 16A:
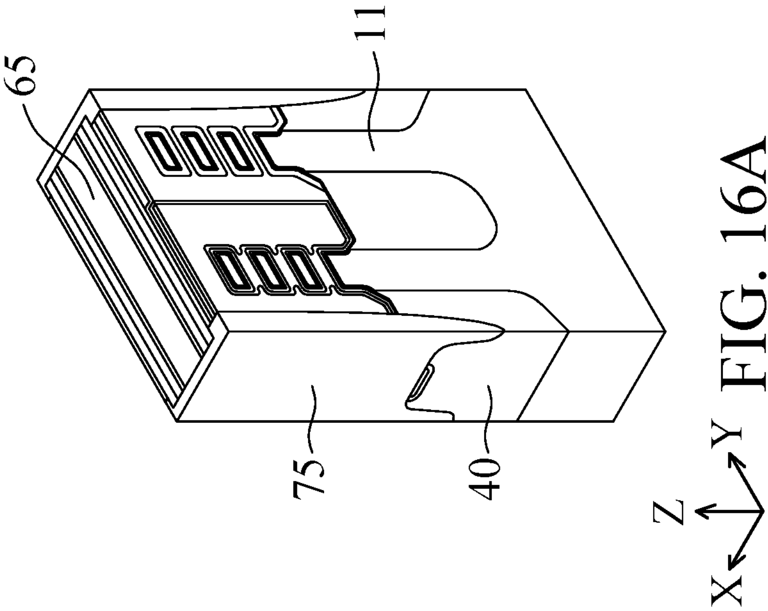

After the semiconductor wires or sheets (channel regions) of the second semiconductor layers 25 are released, a gate dielectric layer 102 is formed around each channel regions, and further, a gate electrode layer 106 is formed on the gate dielectric layer 102, as shown in FIGS. 16A and 16B. In some embodiments, the structure and/or material of the gate electrode for the n-type GAA FET are different from the structure and/or material of the gate electrode for the p-type GAA FET.

In certain embodiments, the gate dielectric layer 102 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 102 is formed over an interfacial layer 101 formed on the channel layers. The gate dielectric layer 102 may be formed by CVD, ALD or any suitable method. In one embodiment, the gate dielectric layer 102 is formed using a highly conformal deposition process, such as ALD, in order to ensure the formation of a gate dielectric layer having a uniform thickness around each channel layers. The thickness of the gate dielectric layer 102 is in a range from about 1 nm to about 6 nm in one embodiment.

In some embodiments of the present disclosure, one or more work function adjustment layers 104 are formed over the gate dielectric layer 102. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. The work function adjustment layer 104N for the n-channel FET include one or more of TaN, TaAlC, TiN, TiC, Co, TiAl, HfTi, TiSi and TaSi, and the work function adjustment layer 104P for the p-channel FET includes one or more of TiAlC, Al, TiAl, TaN, TaAlC, TiN, TiC and Co. The work function adjustment layer may be formed by ALD, PVD, CVD, e-beam evaporation, or other suitable process. Further, the work function adjustment layer may be formed separately for the n-channel FET and the p-channel FET which may use different metal layers.

The gate electrode layer 106 is formed on the gate dielectric layer 102 to surround each channel layer. The gate electrode layer 106 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate electrode 106N for the n-type FET is made of a different material than the gate electrode 106P for the p-type FET.

The gate electrode layer 106 may be formed by CVD, ALD, electro-plating, or other suitable method. The gate dielectric layer and the gate electrode layer are then planarized by using, for example, CMP, until the top surface of the first ILD layer 70 is revealed.

In some embodiments, the CMP process for the metal gate electrode includes several processes. In some embodiments, the metal gate structure before the CMP incudes the work function adjustment layer and a top metal layer (e.g., a W layer). The first process of the CMP is for etching the top metal layer using a first slurry. The second process is for etching the work function adjustment layer formed on the upper surface of the ILD layer 75 using a second slurry. In some embodiments, the down force in the polishing for the second process is greater than the down force for the first process. The third process of the CMP is for further etching the work function adjustment layer and a part of the ILD layer 70 using a third slurry to obtain the structure shown in FIGS. 16A and 16B.

In some embodiments, one or more of the first to third slurries include a stabilizer, such as $H_2O_2$. In some embodiments, a stabilizer is added to the slurry in a small tank (e.g., 10-30 liter), and the slurry with the stabilizer is left standing for about 50 hours to about 100 hours with or without stirring. In some embodiments, several small tanks are prepared, and the slurry of the small tanks is poured into a large tank (e.g., 100-200 liter).

The gate CMP process of the present embodiments can improve thickness or height uniformity of the metal gate. In some embodiments, metal gate height variation within a wafer (e.g., measured at the same position on a chip for all chips in the wafer) is improved by about 40% and is in a range from about 4 nm to about 8 nm (max-min).

In some embodiments, after the planarization operation, the gate electrode layer 106 is recessed and a cap insulating layer (not shown) is formed over the recessed gate electrode layer 106. The cap insulating layer includes one or more layers of a silicon nitride-based material, such as silicon nitride. The cap insulating layer can be formed by depositing an insulating material followed by a planarization operation.

Further, as shown in FIGS. 16A and 16B, the metal gate structures are cut by a groove or trench and the groove or the trench is filled with a dielectric material, thereby forming a gate separation wall 75. In some embodiments, the groove or trench penetrates into the substrate 10 passing through the isolation insulating layer 40. In some embodiments, the gate separation wall 75 is made of silicon nitride or any other suitable dielectric material.

Figure 17B:
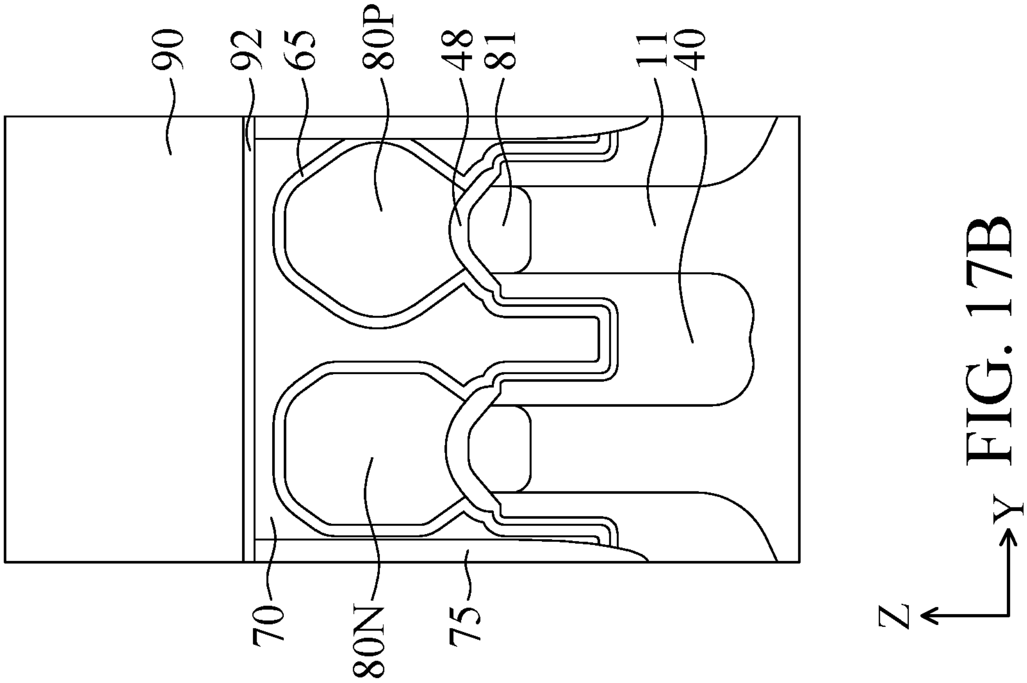
FIGS. 17A and 17B show schematic views of one of the various stages of a sequential manufacturing operation of a semiconductor device according to an embodiment of the present disclosure.
Figure 17A:
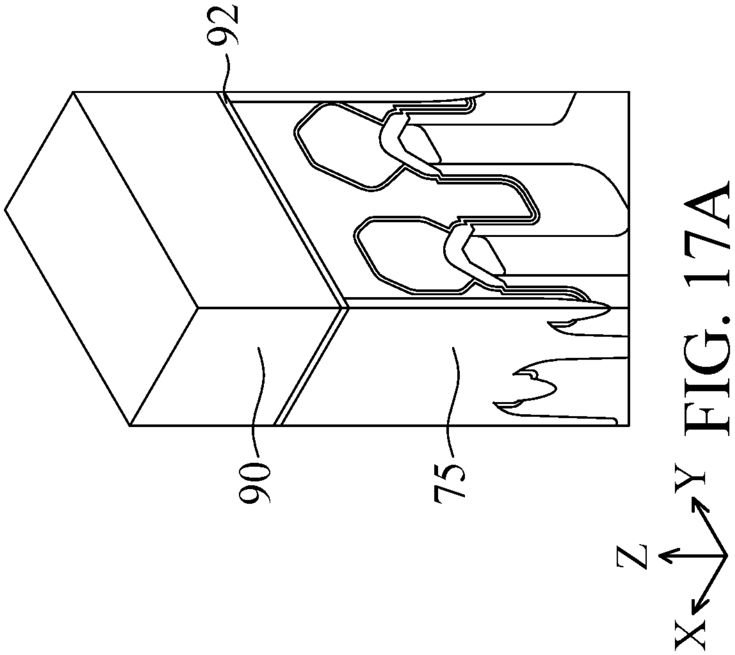

Next, as shown in FIGS. 17A and 17B, a second ESL 92 is formed over the first ILD layer 70 and the gate structures 100, and then a second ILD layer 90 is formed over the second ESL 92. In some embodiments, the second ESL 92 is made of silicon nitride, SiON or any other suitable dielectric material and has a thickness in a range from about 1 nm to about 20 nm. In some embodiments, the second ILD layer 90 is made of silicon oxide, SiON, SiOCN, SiOC, SiCN or any other suitable dielectric material.

Figure 18B:
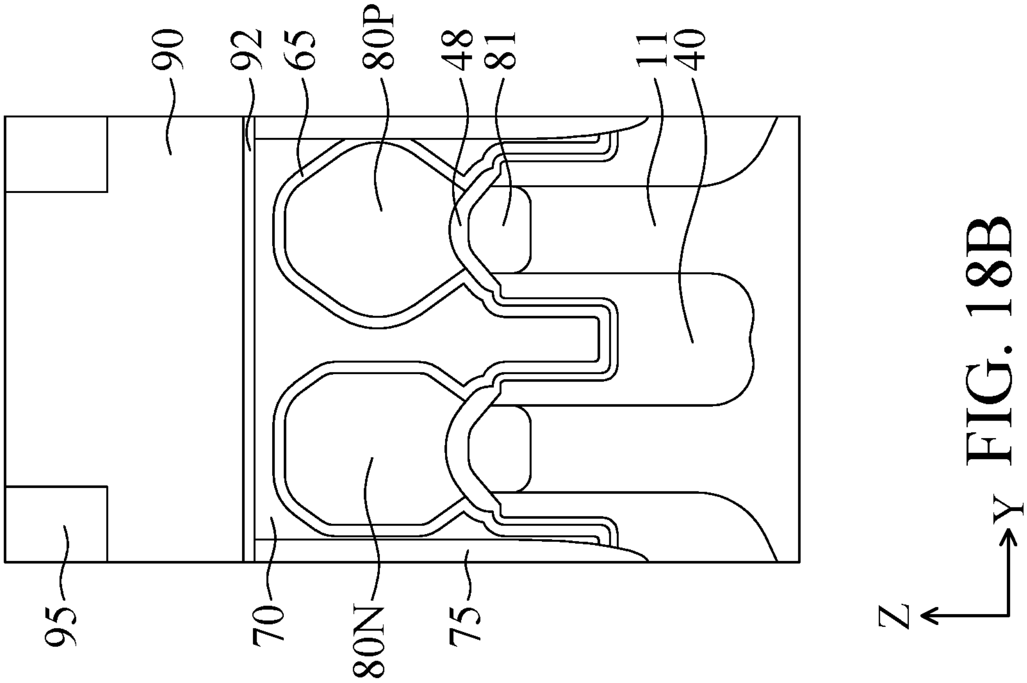
FIGS. 18A and 18B show schematic views of one of the various stages of a sequential manufacturing operation of a semiconductor device according to an embodiment of the present disclosure.
Figure 18A:
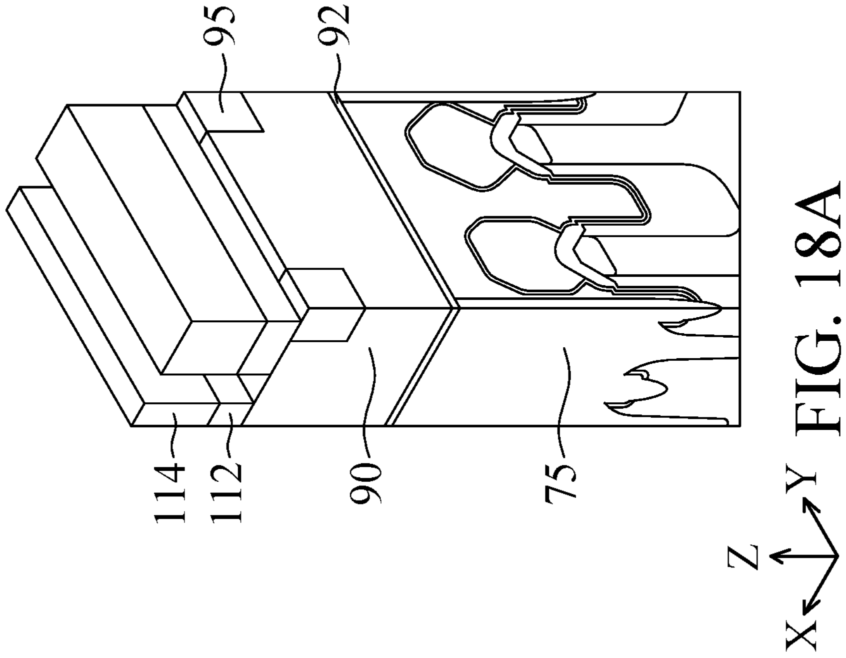

Next, one or more grooves are formed at the upper portion of the second ILD layer 90, and the groove are filled with a hard mask material 95, as shown in FIGS. 18A and 18B. In some embodiments, the hard mask material is polysilicon or amorphous silicon. Then, a first mask layer 112 is formed over the second ILD layer and hard mask material 95 and a second mask layer 114 are formed over the first mask layer 112. Then, a hard mask pattern having openings is formed by patterning the first and second mask layers using one or more lithography and etching operations. In some embodiments, the first mask layer 112 includes tungsten carbide (WC), TiN, TaN or any other suitable material. The second mask layer 114 includes silicon oxide, SiON, SiOC or any other suitable material. The openings are located over the source/drain epitaxial layers 80, respectively.

Figure 19B:
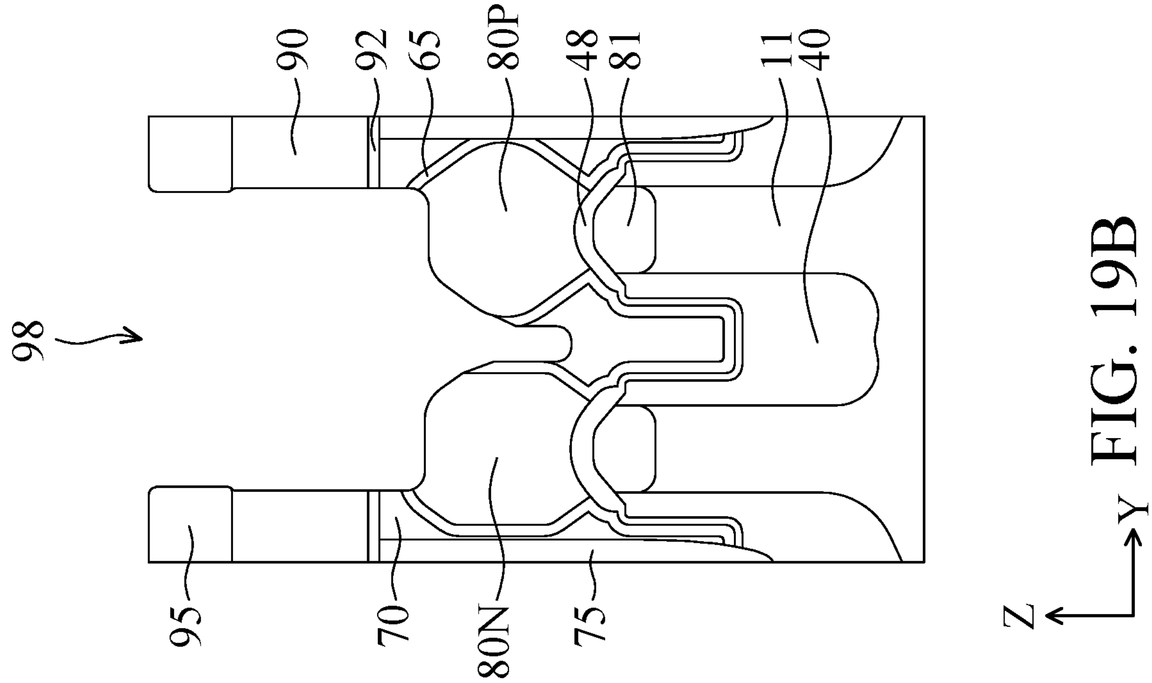
FIGS. 19A and 19B show schematic views of one of the various stages of a sequential manufacturing operation of a semiconductor device according to an embodiment of the present disclosure.
Figure 19A:
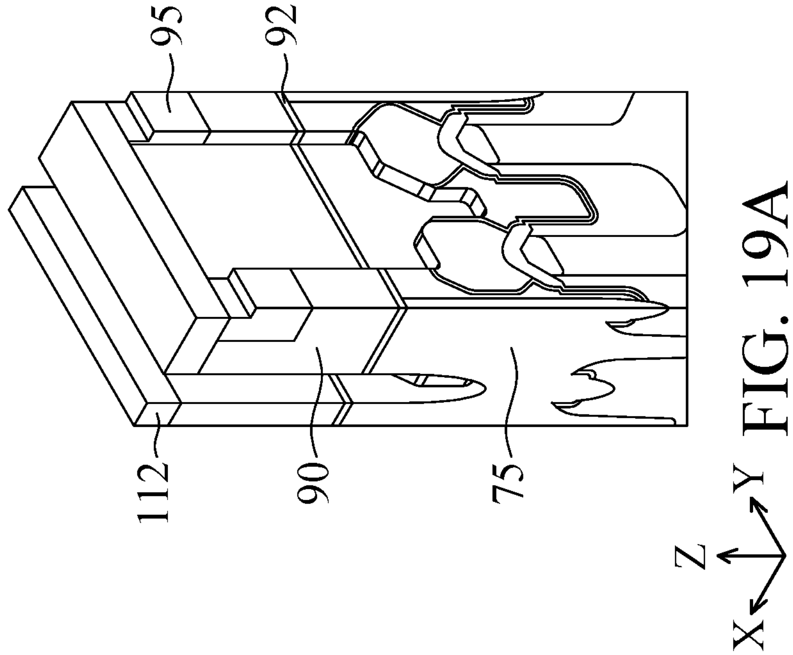

Further, an opening 98 for a source/drain contact is formed in the second ILD layer 90 and the first ILD layer 70 as shown in FIGS. 19A and 19B. At the bottom of the opening 98, the source/drain epitaxial layer 80 is exposed. In some embodiments, as shown in FIGS. 19A and 19B, both the p-type epitaxial layer 80P and the n-type epitaxial layer 80N are exposed in one opening 98 to form a contact contacting both the p-type epitaxial layer 80P and the n-type epitaxial layer 80N. In other embodiments, the p-type epitaxial layer 80P or the n-type epitaxial layer 80N are exposed in separate openings 98.

Figure 20B:
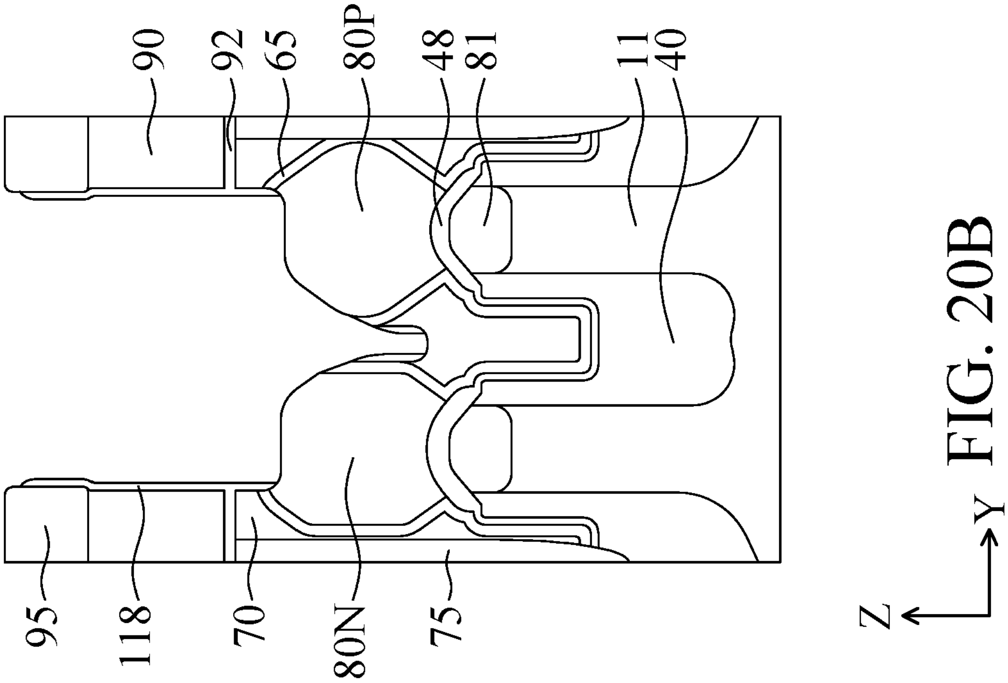
FIGS. 20A and 20B show schematic views of one of the various stages of a sequential manufacturing operation of a semiconductor device according to an embodiment of the present disclosure.
Figure 20A:
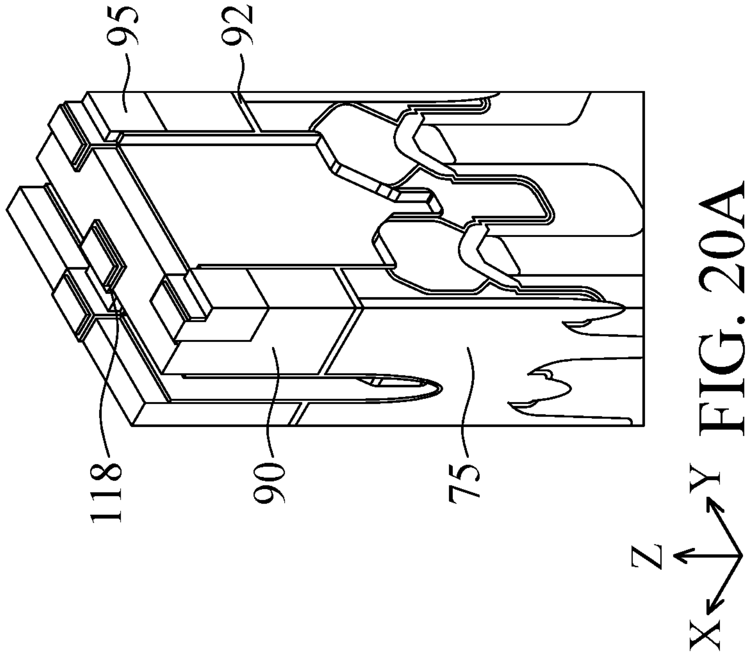

Then, as shown in FIGS. 20A and 20B, a dielectric liner layer 118 is formed on the inner sidewall of the opening 98 by deposition and anisotropic etching operations. In some embodiments, the dielectric liner layer 118 is made of silicon nitride, SiCN or any other suitable material. In some embodiments, the thickness of the dielectric liner layer 118 is in a range from about 1.5 nm to about 5 nm, depending on design and/or process requirements.

Figure 21A:
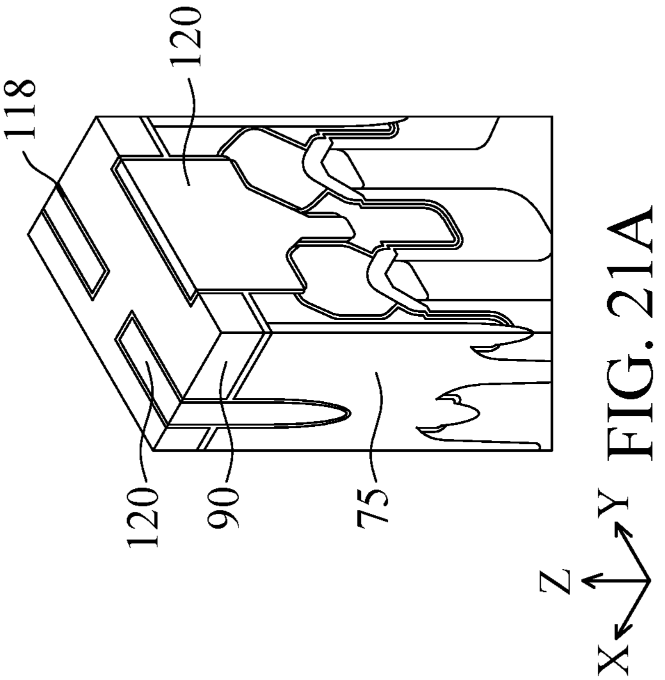
FIGS. 21A and 21B show schematic views of the various stages of a sequential manufacturing operation of a semiconductor device according to an embodiment of the present disclosure.
Figure 21B:
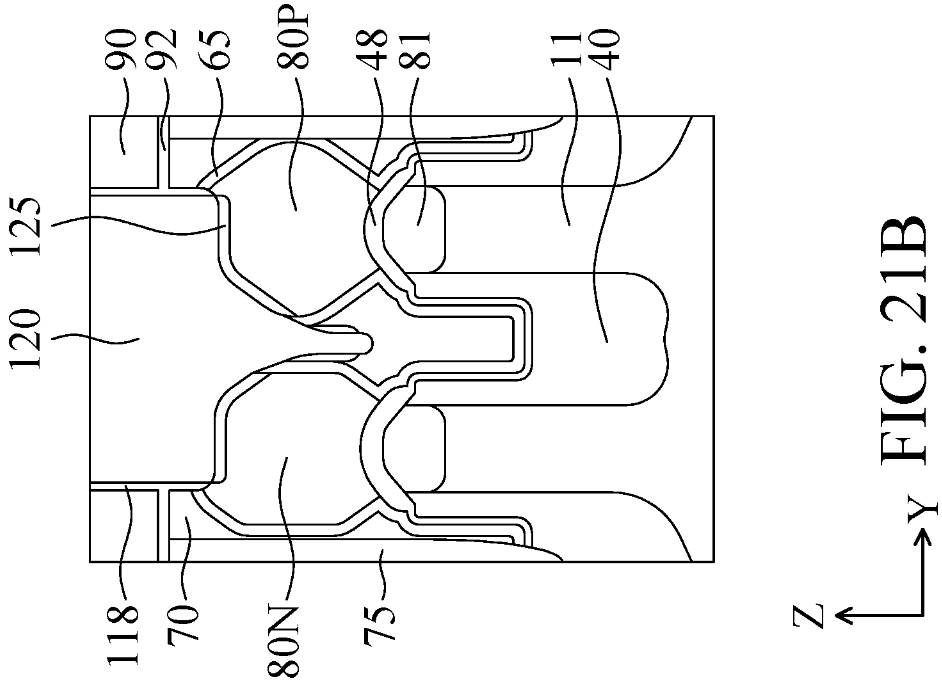

Next, one or more conductive material layers are formed in the first, second and third openings and over the second ILD layer 90, and then one or more planarization operations are performed to expose the upper surface of the second ILD layer 90, thereby forming a source/drain contact 120 contacting the source/drain epitaxial layer 80, as shown in FIGS. 21A and 21B. In some embodiments, the contact 120 is made of one or more layers of Co, Ru, Cu, W, Ni, Mo, Al, Ti or Ta or an alloy thereof. In some embodiments, before the source/drain contact 120 is formed, a silicide layer 125 (e.g., TiSi, NiSi or CoSi) is formed on the source/drain epitaxial layer 80. In some embodiments, the contact 120 includes a barrier layer made of TiN and/or TaN having a thickness in a range from about 1.1 nm to about 5 nm and a body layer made of Co, Ru, Cu, W, Ni, Mo and/or Al. In some embodiments, no barrier layer is formed, and the body layer is a single metal layer.

Figure 22:
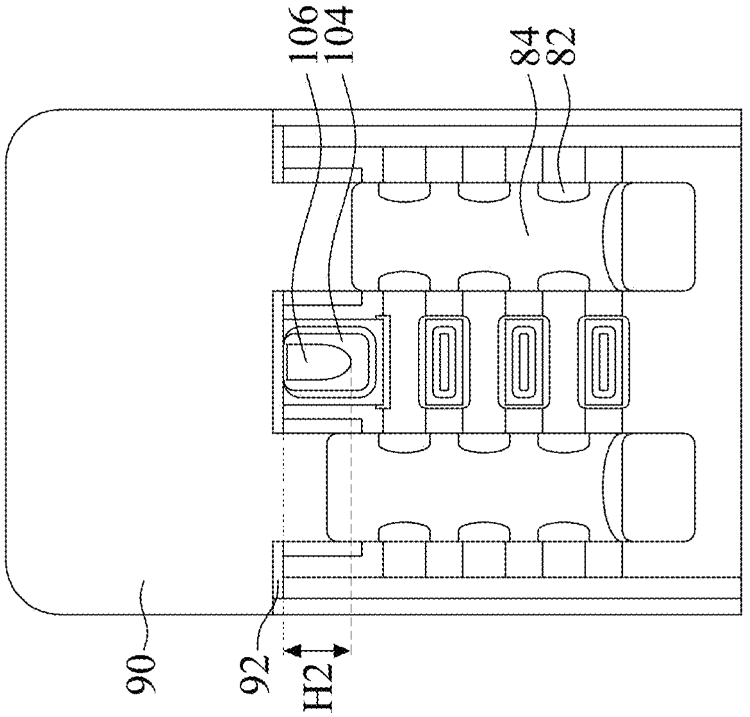
FIG. 22 shows a schematic view of one of the various stages of a sequential manufacturing operation of a semiconductor device according to an embodiment of the present disclosure.

FIG. 22 shows a relationship between a metal gate height and a n-type source/drain epitaxial layer height. In some embodiments, a top of gate electrode is higher than a top of the source/drain epitaxial layer. In some embodiments, the difference H2 between the metal gate height and the source/drain epitaxial layer height is in a range from about 1 nm to about 12 nm and is in a range from about 3 nm to about 10 nm. The variation (max-min) of the height H2 (e.g., measured at 10 points (e.g., 10 FETs) on a chip) is more than about 0.5 nm to and less than about 1.5 nm in some embodiments. When the difference H2 is more than the range, the number of defective chips may increase (e.g., about 10 times to about 500 times). When the H2 is smaller than the range, a short circuit between the source/drain contact and the metal gate electrode may occur.

In the foregoing embodiments, the height variations of the gate electrode and/or the source/drain epitaxial layers are suppressed, and thus process and design margins for forming the source/drain contact can be improved. In addition, a narrower and taller source/drain epitaxial layer also improves the process and design margins for forming the source/drain contact.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a fin structure, in which first semiconductor layers and second semiconductor layers are alternately stacked over a substrate, is formed, a sacrificial gate structure is formed over the fin structure, a source/drain region of the fin structure, which is not covered by the sacrificial gate structure, is etched thereby forming a source/drain space, a bottom epitaxial layer is formed in the source/drain space, a first epitaxial layer is formed over the bottom epitaxial layer, and a second epitaxial layer is formed over the first epitaxial layer. When the first epitaxial layer is formed, a first process and a second process followed by the first process are performed, both of which includes a deposition phase and an etching phase followed by the deposition phase. A process time ratio of the deposition phase to the etching phase in the first process is greater than a process time ratio of the deposition phase to the etching phase in the second process. In one or more of the foregoing and/or following embodiments, the process time ratio of the deposition phase to the etching phase in the first process is in a range from 1.3 to 1.5. In one or more of the foregoing and/or following embodiments, the process time ratio of the deposition phase to the etching phase in the second process is in a range from 1.11 to 1.15. In one or more of the foregoing and/or following embodiments, the forming the second epitaxial layer comprises a deposition phase and an etching phase followed by the deposition phase. In one or more of the foregoing and/or following embodiments, a process time ratio of the deposition phase to the etching phase for forming the second epitaxial layer is greater than the process time ratio of the deposition phase to the etching phase in the first process for forming the first epitaxial layer. In one or more of the foregoing and/or following embodiments, the process time ratio of the deposition phase to the etching phase for forming the second epitaxial layer is in a range from 1.18 to 1.26. In one or more of the foregoing and/or following embodiments, a process gas for the deposition phase includes $SiH_2Cl_2$ and a process gas for the etching phase includes HCl. In one or more of the foregoing and/or following embodiments, a treatment using $SiH_4$ an HCl is performed between the forming the first epitaxial layer and the forming a second epitaxial layer.

In accordance with another aspect of the present disclosure, in a method of manufacturing a semiconductor device, a fin structure, in which first semiconductor layers and second semiconductor layers are alternately stacked over a substrate, is formed, a sacrificial gate structure including a sacrificial gate dielectric layer and sacrificial gate electrode layer is formed over the fin structure, a source/drain region of the fin structure, which is not covered by the sacrificial gate structure, is etched thereby forming a source/drain space, a bottom epitaxial layer is formed in the source/drain space, a first epitaxial layer is formed over the bottom epitaxial layer, a second epitaxial layer is formed over the first epitaxial layer, and a width of the second epitaxial layer is reduced by performing a trimming operation. The width of the second epitaxial layer after the trimming operation is 70-90% of the width of the second epitaxial layer before the trimming operation. In one or more of the foregoing and/or following embodiments, a variation of the width of the second epitaxial layer after the trimming is more than 0.3 nm to and less than 1.0 nm. In one or more of the foregoing and/or following embodiments, a height of the second epitaxial layer measured from an interface between the sacrificial gate dielectric layer and an uppermost one of the second semiconductor layers after the trimming operation is 85-95% the height of the second epitaxial layer before the trimming operation. In one or more of the foregoing and/or following embodiments, a variation of the height of the second epitaxial layer after the trimming is more than 0.1 nm to and less than 0.8 nm. In one or more of the foregoing and/or following embodiments, a third epitaxial layer is formed over the second epitaxial layer. In one or more of the foregoing and/or following embodiments, after the trimming etching, the third epitaxial layer remains. In one or more of the foregoing and/or following embodiments, a source gas for the trimming operation includes HCl and at least one of $GeH_4$ or $SiH_4$. In one or more of the foregoing and/or following embodiments, the semiconductor device includes a p-type field effect transistor (FET) and an n-type FET, and a source/drain epitaxial layer of the p-type FET is not subjected to the trimming operation.

In accordance with another aspect of the present disclosure, in method of manufacturing a semiconductor device, a fin structure in which first semiconductor layers and second semiconductor layers are alternately stacked over a substrate, is formed, a sacrificial gate structure is formed over the fin structure, a source/drain region of the fin structure, which is not covered by the sacrificial gate structure, is etched thereby forming a source/drain space, a bottom epitaxial layer is formed in the source/drain space, a dielectric layer is formed over the bottom epitaxial layer, a first epitaxial layer is formed over lateral end faces of the second semiconductor layers, a second epitaxial layer is formed over the first epitaxial layer, and a width of the second epitaxial layer is reduced by performing a trimming operation. When the first epitaxial layer is formed, a first process and a second process followed by the first process are performed, the second process and the forming the second epitaxial layer each include a deposition phase and an etching phase followed by the deposition phase, and a process time ratio of the deposition phase to the etching phase in the second process is smaller than a process time ratio of the deposition phase to the etching phase for the second epitaxial layer. In one or more of the foregoing and/or following embodiments, the second epitaxial layer is in contact with the dielectric layer. In one or more of the foregoing and/or following embodiments, the trimming operation includes a first process using a source gas including HCl and $GeH_4$ and a second process using a source gas including HCl and $SiH_4$. In one or more of the foregoing and/or following embodiments, the process time ratio of the deposition phase to the etching phase in the second process is in a range from 1.11 to 1.15. In one or more of the foregoing and/or following embodiments, the process time ratio of the deposition phase to the etching phase for forming the second epitaxial layer is in a range from 1.18 to 1.26.

In accordance with another aspect of the present disclosure, a semiconductor device includes a plurality of field effect transistors (FETs). Each of the FETs includes semiconductor sheets or wires disposed over and vertically arranged over a bottom fin structure disposed over a substrate, a gate electrode, and a source/drain epitaxial layer. A variation in height differences between a top of the source/drain epitaxial layer and a top of the gate electrode among the plurality of FETs is in a range from 0.5 nm to 1.5 nm. In one or more of the foregoing and/or following embodiments, a variation in height of the source/drain epitaxial layer among the plurality of FETs is in a range from 0.1 nm to and 0.8 nm. In one or more of the foregoing and/or following embodiments, a variation in width of the source/drain epitaxial layer among the plurality of FETs is in a range from 0.3 nm to and 1.0 nm. In one or more of the foregoing and/or following embodiments, the semiconductor device further includes a bottom epitaxial layer disposed in a recess formed in the bottom fin structure. In one or more of the foregoing and/or following embodiments, the semiconductor device further includes a dielectric layer between the bottom epitaxial layer and the source/drain epitaxial layer.

In accordance with another aspect of the present disclosure, a semiconductor device includes a plurality of gate-all-around field effect transistors (GAA FETs). Each of the plurality of GAA FETs includes semiconductor sheets or wires disposed over and vertically arranged over a bottom fin structure disposed over a substrate, a gate electrode, and a source/drain epitaxial layer. In at least one of the plurality of GAA FET, a difference between a top of gate electrode and a top of the source/drain epitaxial layer is in equal to or less than 12 nm. In one or more of the foregoing and/or following embodiments, the difference is in a range from 3 nm to 12 nm. In one or more of the foregoing and/or following embodiments, a variation in height differences between the top of the source/drain epitaxial layer and the top of the gate electrode among the plurality of GAA FETs is in a range from 0.5 nm to 1.5 nm. In one or more of the foregoing and/or following embodiments, a variation in height of the source/drain epitaxial layer among the plurality of FETs is in a range from 0.1 nm to and 0.8 nm. In one or more of the foregoing and/or following embodiments, a variation in width of the source/drain epitaxial layer among the plurality of FETs is in a range from 0.3 nm to and 1.0 nm. In one or more of the foregoing and/or following embodiments, the semiconductor device further includes a bottom epitaxial layer disposed in a recess formed in the bottom fin structure. In one or more of the foregoing and/or following embodiments, the semiconductor device further includes a dielectric layer between the bottom epitaxial layer and the source/drain epitaxial layer. In one or more of the foregoing and/or following embodiments, the plurality of GAA FETs include an n-type GAA FET and a p-type GAA FET, and a width of the source/drain epitaxial layer of the n-type GAA FET is smaller than a width of the source/drain epitaxial layer of the p-type GAA FET.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

forming a fin structure in which first semiconductor layers and second semiconductor layers are alternately stacked over a substrate;

forming a sacrificial gate structure over the fin structure;

etching a source/drain region of the fin structure, which is not covered by the sacrificial gate structure, thereby forming a source/drain space;

forming a bottom epitaxial layer in the source/drain space; forming a first epitaxial layer over the bottom epitaxial layer; and forming a second epitaxial layer over the first epitaxial layer, wherein:

the forming the first epitaxial layer comprises a first process and a second process followed by the first process, both of which includes a deposition phase and an etching phase followed by the deposition phase, a process time ratio of the deposition phase to the etching phase in the first process is greater than a process time ratio of the deposition phase to the etching phase in the second process, and a treatment using $SiH_4$ and HCl is performed between the forming the first epitaxial layer and the forming the second epitaxial layer.

2. The method of claim 1, wherein the process time ratio of the deposition phase to the etching phase in the first process is in a range from 1.3 to 1.5.

3. The method of claim 1, wherein the process time ratio of the deposition phase to the etching phase in the second process is in a range from 1.11 to 1.15.

4. The method of claim 1, wherein:

the forming the second epitaxial layer comprises a deposition phase and an etching phase followed by the deposition phase, and a process time ratio of the deposition phase to the etching phase for forming the second epitaxial layer is greater than the process time ratio of the deposition phase to the etching phase in the first process for forming the first epitaxial layer.

5. The method of claim 4, wherein the process time ratio of the deposition phase to the etching phase for forming the second epitaxial layer is in a range from 1.18 to 1.26.

6. The method of claim 1, wherein a process gas for the deposition phase includes $SiH_2Cl_2$.

7. The method of claim 6, wherein a process gas for the etching phase includes HCL.

8. A method of manufacturing a semiconductor device, comprising:

forming a fin structure in which first semiconductor layers and second semiconductor layers are alternately stacked over a substrate;

forming a sacrificial gate structure including a sacrificial gate dielectric layer and sacrificial gate electrode layer over the fin structure;

etching a source/drain region of the fin structure, which is not covered by the sacrificial gate structure, thereby forming a source/drain space;

forming a bottom epitaxial layer in the source/drain space; forming a first epitaxial layer over the bottom epitaxial layer; forming a second epitaxial layer over the first epitaxial layer; and reducing a width of the second epitaxial layer by performing a trimming operation, wherein the width of the second epitaxial layer after the trimming operation is 70-90% of the width of the second epitaxial layer before the trimming operation, and a source gas for the trimming operation includes HCl and at least one of $GeH_4$ or $SiH_4$.

9. The method of claim 8, wherein a variation of the width of the second epitaxial layer after the trimming operation is more than 0.3 nm to and less than 1.0 nm.

10. The method of claim 8, wherein a height of the second epitaxial layer measured from an interface between the sacrificial gate dielectric layer and an uppermost one of the second semiconductor layers after the trimming operation is 85-95% the height of the second epitaxial layer before the trimming operation.

11. The method of claim 10, wherein a variation of the height of the second epitaxial layer after the trimming operation is more than 0.1 nm to and less than 0.8 nm.

12. The method of claim 8, further comprising forming a third epitaxial layer over the second epitaxial layer.

13. The method of claim 12, wherein after the trimming operation, the third epitaxial layer remains.

14. The method of claim 8, wherein:

the semiconductor device includes a p-type field effect transistor (FET) and an n-type FET.

15. The method of claim 14, wherein a source/drain epitaxial layer of the p-type FET is not subjected to the trimming operation.

16. A method of manufacturing a semiconductor device, comprising:

forming a fin structure in which first semiconductor layers and second semiconductor layers are alternately stacked over a substrate;

forming a sacrificial gate structure over the fin structure;

etching a source/drain region of the fin structure, which is not covered by the sacrificial gate structure, thereby forming a source/drain space;

forming a bottom epitaxial layer in the source/drain space;

forming a dielectric layer over the bottom epitaxial layer;

forming a first epitaxial layer over lateral end faces of the second semiconductor layers;

forming a second epitaxial layer over the first epitaxial layer; and reducing a width of the second epitaxial layer by performing a trimming operation, wherein:

the forming the first epitaxial layer comprises a first process and a second process followed by the first process, the second process and the forming the second epitaxial layer each include a deposition phase and an etching phase followed by the deposition phase, a process time ratio of the deposition phase to the etching phase in the second process is smaller than a process time ratio of the deposition phase to the etching phase for the second epitaxial layer, and the process time ratio of the deposition phase to the etching phase in the second process is in a range from 1.11 to 1.15.

17. The method of claim 16, wherein the second epitaxial layer is in contact with the dielectric layer.

18. The method of claim 16, wherein the trimming operation includes a first process using a source gas including HCl and $GeH_4$.

19. The method of claim 18, wherein the trimming operation includes a second process using a source gas including HCL and $SiH_4$.

20. The method of claim 19, wherein a process time of the first process of the trimming operation is shorter than a process time of the second process of the trimming operation.

* * * * *